US012707711B2

(12) United States Patent
Hwang et al.

(10) Patent No.: US 12,707,711 B2
(45) Date of Patent: Aug. 11, 2026

(54) SEMICONDUCTOR DEVICE WITH CMOS INVERTER

(71) Applicant: SAMSUNG ELECTRONICS CO., LTD., Suwon-si (KR)

(72) Inventors: Beomyong Hwang, Seoul (KR); Jihye Kwon, Yongin-si (KR); Jiyoung Kim, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 896 days.

(21) Appl. No.: 17/937,473

(22) Filed: Oct. 3, 2022

(65) Prior Publication Data

US 2023/0178550 A1 Jun. 8, 2023

(30) Foreign Application Priority Data

Dec. 2, 2021 (KR) ........................ 10-2021-0170965

(51) Int. Cl.
*H10D 84/85* (2025.01)
*H10D 30/63* (2025.01)
(Continued)

(52) U.S. Cl.
CPC ............ *H10D 84/85* (2025.01); *H10D 30/63* (2025.01); *H10D 64/252* (2025.01);
(Continued)

(58) Field of Classification Search
CPC .. H10D 30/63; H10D 30/6728; H10D 64/252; H10D 64/513; H10D 84/0172;
(Continued)

(56) References Cited

U.S. PATENT DOCUMENTS 6,174,763 B1 1/2001 Beilstein, Jr. et al.
6,864,519 B2 3/2005 Yeo et al.
(Continued)

FOREIGN PATENT DOCUMENTS

| | | |
|---|---|---|
| JP | 2014-236160 | 12/2014 |
| KR | 10-2009-0025236 A | 3/2009 |
| KR | 10-0924873 | 10/2009 |

OTHER PUBLICATIONS

Office Action dated Mar. 17, 2025 issued in corresponding Korean Patent Application No. 10-2021-0170965.

*Primary Examiner* — Matthew C Landau
*Assistant Examiner* — Dmitriy Yemelyanov
(74) *Attorney, Agent, or Firm* — Morgan, Lewis & Bockius LLP

(57) ABSTRACT

A semiconductor device includes a buried insulation layer pattern on a lower substrate. A first semiconductor pattern and a second semiconductor pattern pattern are disposed on on the buried insulation layer pattern. A lower conductive pattern is formed in a lower portion of a first recess between the first and second semiconductor patterns, and the lower conductive pattern may contact lower sidewalls of the first and second semiconductor patterns. A common gate structure formed on the lower conductive pattern fills a remaining portion of the first recess. The first semiconductor pattern may include a first impurity region, a first channel region, and a second impurity region sequentially stacked from an upper surface of the first semiconductor towards the lower substrate. The second semiconductor pattern includes a third impurity region, a second channel region, and a fourth impurity region.

20 Claims, 27 Drawing Sheets

(51) Int. Cl.
*H10D 64/23* (2025.01)
*H10D 84/01* (2026.01)
*H10D 84/03* (2025.01)

(52) U.S. Cl.
CPC ..... *H10D 84/0186* (2025.01); *H10D 84/0195* (2025.01); *H10D 84/038* (2025.01)

(58) Field of Classification Search
CPC ........... H10D 84/0186; H10D 84/0195; H10D 84/038; H10D 84/85; H10D 86/01; H10D 86/201
See application file for complete search history.

(56) References Cited

U.S. PATENT DOCUMENTS

| | | | | |
|---|---|---|---|---|
| 8,039,893 | B2 | 10/2011 | Masuoka | |
| 8,367,505 | B2 | 2/2013 | Hanafi et al. | |
| 8,395,204 | B2 | 3/2013 | Kawaguchi | |
| 9,425,197 | B2 | 8/2016 | Nitta et al. | |
| 10,269,867 | B2 | 4/2019 | Yokoyama et al. | |
| 2004/0004898 | A1 * | 1/2004 | Kim | G11C 8/16 365/230.03 |
| 2011/0186927 | A1 | 8/2011 | Kawaguchi et al. | |
| 2013/0062673 | A1 * | 3/2013 | Masuoka | H10F 39/80377 257/291 |
| 2016/0322422 | A1 * | 11/2016 | Yokoyama | H10D 84/0198 |
| 2017/0162583 | A1 | 6/2017 | Lee et al. | |
| 2017/0213908 | A1 | 7/2017 | Fursin et al. | |
| 2019/0214482 | A1 | 7/2019 | Xie et al. | |

* cited by examiner

SEMICONDUCTOR DEVICE WITH CMOS INVERTER

CROSS-REFERENCE TO RELATED APPLICATION

This application claims priority under 35 USC § 119 to Korean Patent Application No. 10-2021-0170965, filed on Dec. 2, 2021, in the Korean Intellectual Property Office (KIPO), the disclosure of which is incorporated by reference herein in its entirety.

TECHNICAL FIELD

Embodiments relates to a semiconductor device. More particularly, the embodiments relates to a semiconductor device including a CMOS inverter structure.

DISCUSSION OF THE RELATED ART

Complementary MOSFET (CMOS) technology is applied in many semiconductor devices, and may provide circuits for mobile devices, cameras, CPUs, and the like. CMOS technology offers low power dissipation, high speed, and high noise immunity.

The CMOS inverter circuit may include an N-type transistor, a P-type transistor, and a wiring structure for connecting the N-type and P-type transistors. However, to form an inverter circuit, N-type transistors and the P-type transistors are formed on a substrate in their own horizontal span of the substrate, and as a result, the horizontal area of the substrate for forming the CMOS inverter circuit may be increased.

SUMMARY

Example embodiments provide a highly integrated semiconductor device.

Example embodiments provide method for manufacturing a highly integrated semiconductor device.

A semiconductor device according to example embodiments includes a buried insulation layer pattern on a lower substrate; a first semiconductor pattern and a second semiconductor pattern disposed on the buried insulation layer pattern, the first semiconductor pattern and the second semiconductor pattern extending in a first direction parallel to the lower substrate and spaced apart from each other in a second direction by a first recess, the second direction parallel to the lower substrate and perpendicular to the first direction; a lower conductive pattern disposed in a lower portion of the first recess between the first and second semiconductor patterns, the lower conductive pattern contacting lower regions of the first and second semiconductor patterns; and a common gate structure disposed on the lower conductive pattern, the common gate structure at least partially filling the first recess, wherein the first semiconductor pattern includes a first impurity region, a first channel region, and a second impurity region in the first semiconductor pattern, the first impurity region, the first channel region, and the second impurity region being sequentially disposed vertically from an upper surface of the first semiconductor pattern, and wherein the second semiconductor pattern includes a third impurity region, a second channel region, and a fourth impurity region in the second semiconductor pattern, the third impurity region, the second channel region, and the fourth impurity region sequentially disposed vertically from an upper surface of the second semiconductor pattern.

A semiconductor device according to example embodiments includes a buried insulation layer disposed on a lower substrate; a first semiconductor pattern and a second semiconductor pattern disposed on the buried insulation layer, the first semiconductor pattern and the second semiconductor pattern extending in a first direction parallel to the lower substrate and spaced apart from each other in a second direction by a first recess, the second direction parallel to the lower substrate and perpendicular to the first direction; a first lower conductive pattern disposed in a lower portion of the first recess between the first and second semiconductor patterns, the first lower conductive pattern contacting lower regions of the first and second semiconductor patterns; a first common gate structure disposed on the first lower conductive pattern, the first common gate structure filling a remaining portion of the first recess; a first impurity region, a first channel region, and a second impurity region in the first semiconductor pattern, the first impurity region, the first channel region, and the second impurity region sequentially disposed from an upper surface of the first semiconductor pattern towards the lower substrate; a third impurity region, a second channel region, and a fourth impurity region in the second semiconductor pattern, the third impurity region, the second channel region, and the fourth impurity region sequentially disposed from an upper surface of the second semiconductor pattern towards the lower substrate; a third semiconductor pattern and a fourth semiconductor pattern disposed on the buried insulation layer, the third semiconductor pattern and the fourth semiconductor pattern disposed parallel to the first and second semiconductor patterns, respectively, and respectively spaced apart from the first and second semiconductor patterns in the first direction, and spaced apart from each other by a second recess in the second direction; a second lower conductive pattern in a lower portion of a second recess between the third and fourth semiconductor patterns, the second lower conductive pattern contacting lower regions of the third and fourth semiconductor patterns; a second common gate structure disposed on the second lower conductive pattern, the second common gate structure filling a remaining portion of the second recess; a fifth impurity region, a third channel region, and a sixth impurity region in the third semiconductor pattern, the fifth impurity region, the third channel region, and the sixth impurity region sequentially disposed from an upper surface of the third semiconductor pattern towards the lower substrate; a seventh impurity region, a fourth channel region, and an eighth impurity region in the fourth semiconductor pattern, the seventh impurity region, the fourth channel region, and the eighth impurity region sequentially disposed from an upper surface of the fourth semiconductor pattern towards the lower substrate; a first wiring electrically to with the first lower conductive pattern and the second common gate structure; and a second wiring electrically connected to the second lower conductive pattern and the first common gate structure.

A semiconductor device according to example embodiments includes a buried insulation layer pattern on a lower substrate; a first semiconductor pattern extending in a first direction parallel to the lower substrate and including an N-type upper impurity region, a P-type impurity region and an N-type lower impurity region stacked vertically from an upper surface of the first semiconductor pattern towards the buried insulation layer; a second semiconductor pattern extending in the first direction and adjacent to the first semiconductor pattern and spaced apart from the first semiconductor pattern in a second direction parallel to the lower substrate, the second semiconductor pattern including a P-type upper impurity region, an N-type impurity region and a P-type lower impurity region stacked vertically from an upper surface of the second semiconductor pattern towards the buried insulation layer; a lower conductive pattern disposed in a space between the first and second semiconductor patterns, the lower conductive pattern electrically connecting to the P-type lower impurity region and the N-type lower impurity region; and a common gate structure disposed on the lower conductive pattern, the common gate structure filling a remaining space between the first and second semiconductor patterns; wherein the common gate structure includes a gate insulation layer pattern, a gate electrode, and a capping insulation pattern, and wherein the gate electrode and the lower conductive pattern are insulated from each other by the gate insulation layer pattern.

In the semiconductor device according to example embodiments, the first and second transistors having vertical channels may be formed at both sides of the common gate structure, respectively. The first and second transistors may have different conductivity types. The semiconductor device may include a CMOS inverter circuit, and may be formed on a lower substrate of a small horizontal area.

BRIEF DESCRIPTION OF THE DRAWINGS

Example embodiments will be more clearly understood from the following detailed description taken in conjunction with the accompanying drawings.

FIG. 1 is a cross-sectional view of a semiconductor device in accordance with example embodiments;

FIG. 2 is a perspective view of the semiconductor device shown in FIG. 1;

FIG. 3 is a circuit diagram that corresponds to the semiconductor device shown in FIG. 1, FIG. 4 is a perspective view of a semiconductor device in accordance with example embodiments;

FIG. 5 is a cross-sectional view of the semiconductor device shown in FIG. 4;

FIG. 6 is a circuit diagram corresponding to the semiconductor device shown in FIG. 4; and FIGS. 7 to 27 are perspective views and cross-sectional views that illustrate a method of manufacturing a semiconductor device in accordance with example embodiments.

DESCRIPTION OF EMBODIMENTS

Figure 1:
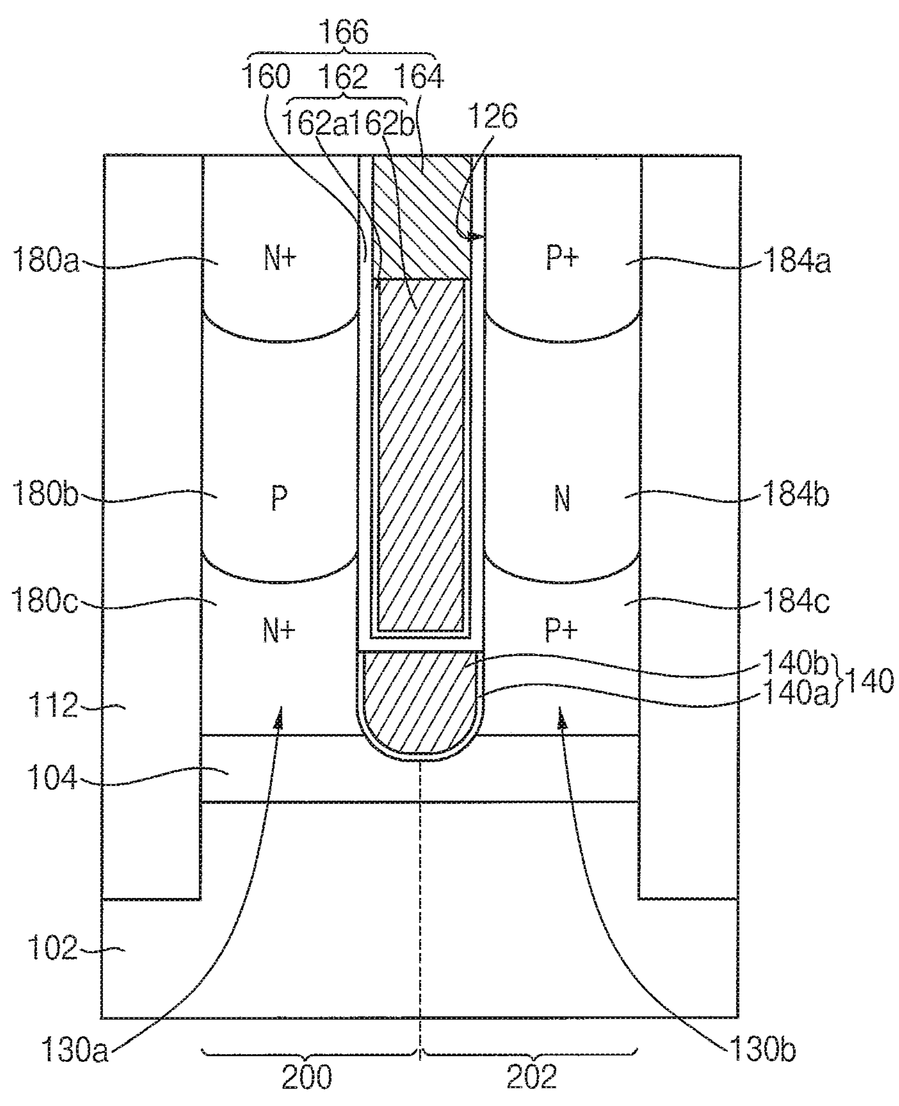
FIGS. 1 to 27 represent non-limiting, example embodiments as described herein.
Figure 1:
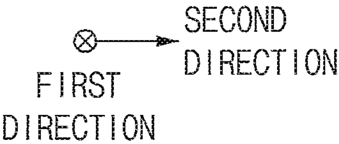

Embodiments of the present disclosure will now be described more fully hereinafter with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers may indicate the same components throughout the specification, and to the extent that a description of an element has been omitted, it may be understood that the element is at least similar to corresponding elements that are described elsewhere in the specification.

Further, the drawings attached to the present specification are provided for ease of explaining the embodiments of the present disclosure. Shapes of the components shown in the drawings may be exaggerated and displayed to aid understanding. Therefore, the dimensions and shapes of the components in the embodiments should not necessarily be limited by the drawings.

Figure 2:
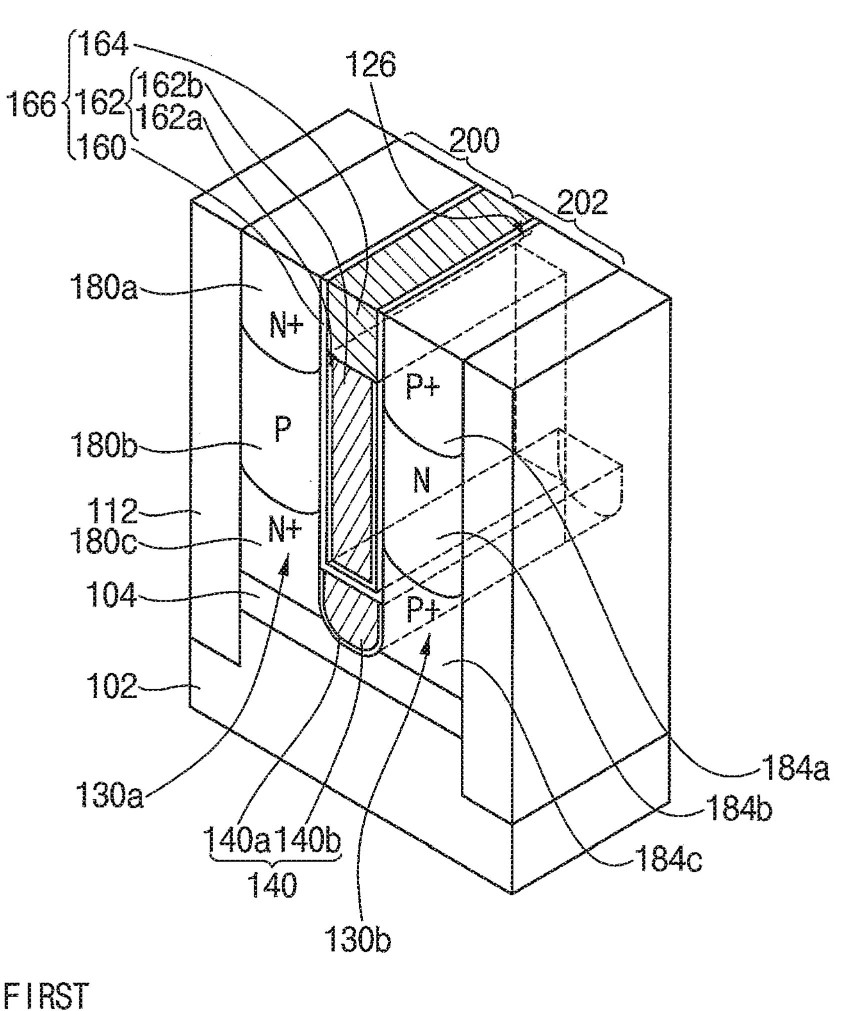
Figure 3:
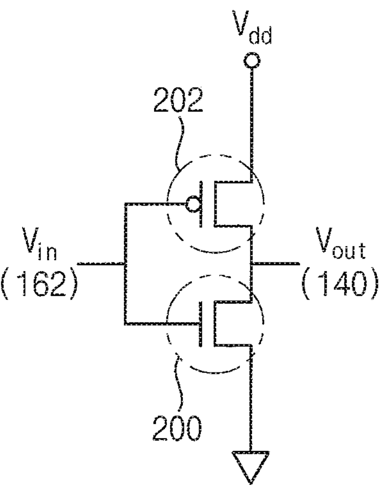

FIG. 1 is a cross-sectional view of a semiconductor device in accordance with example embodiments. FIG. 2 is a perspective view of the semiconductor device shown in FIG. 1. FIG. 3 is a circuit diagram that corresponds to the semiconductor device shown in FIG. 1.

The semiconductor device shown in FIGS. 1 to 3 may be a CMOS inverter circuit. For example, the semiconductor device may accept a voltage as input, and output the inverse of the input voltage.

Referring to FIGS. 1 and 2, a substrate may include a semiconductor material such as silicon, germanium, silicon-germanium, or the like, or a group III-V compound semiconductor such as GaP, GaAs, or GaSb. In example embodiments, the substrate may be a silicon-on-insulator (SOI) substrate or a germanium-on-insulator (GOI) substrate. For example, the substrate may include a lower substrate 102, a buried insulation layer pattern 104, and a patterned upper semiconductor layer. The lower substrate 102 and the upper semiconductor layer may include, e.g., silicon, and the buried insulation layer pattern 104 may include, e.g., silicon oxide.

Isolation patterns 112 may extend vertically from an upper surface of the substrate. The isolation patterns 112 may vertically extend from an upper surface of the upper semiconductor layer to an upper portion of the lower substrate 102. Bottoms of the isolation patterns 112 may be positioned at an upper portion of the lower substrate 102. The isolation patterns 112 may extend in a first direction parallel to the upper surface of the substrate. Accordingly, the isolation patterns 112 may extend vertically and in the first direction, and may form a channel in the upper portion of the substrate. The buried insulation layer pattern 104 and upper semiconductor patterns **130*a* and 130*b* may be formed between the isolation patterns 112**.

A first recess 126 extending in the first direction may be formed between the upper semiconductor patterns **130*a* and 130*b*. An upper portion of the buried insulation layer pattern 104 may be exposed by a bottom of the first recess 126. For example, the upper semiconductor patterns 130*a* and 130*b* may be disposed at both sides of the first recess 126, and the upper semiconductor patterns 130*a* and 130*b* may be separated by the first recess 126. Hereinafter, the upper semiconductor pattern positioned at a left of the first recess 126 may be referred to as a first semiconductor pattern 130*a*, and the upper semiconductor pattern positioned at a right of the first recess 126 may be referred to as a second semiconductor pattern 130*b***.

A first barrier metal pattern **140*a* and a first metal pattern 140*b* may be formed at a lower portion of the first recess 126. The first barrier metal pattern 140*a* may surround sidewalls and a bottom surface of the first metal pattern 140*b*. The first barrier metal pattern 140*a* and the first metal pattern 140*b* may constitute a lower conductive pattern 140**.

In example embodiments, the first barrier metal pattern **140*a* may include, e.g., titanium, titanium nitride, tantalum, tantalum nitride, tungsten nitride, tungsten carbonitride, or the like. In example embodiments, the first metal pattern 140*b* may include, e.g., tungsten, aluminum, copper, or the like. For example, the first metal pattern 140*b*** may include tungsten.

A first sidewall of the lower conductive pattern 140 may contact the first semiconductor pattern **130*a*, and a second sidewall opposite to the first sidewall of the lower conductive pattern 140 may contact the second semiconductor pattern 130***b*. Thus, lower portions of the first and second semiconductor patterns 130*a* and 130*b* may be electrically connected to each other by the lower conductive pattern 140.

A common gate structure 166 may be formed on the lower conductive pattern 140 in the first recess 126, and between the first semiconductor pattern 130*a* and the second semiconductor pattern 130*b*. In example embodiments, the first recess 126 may be completely filled by the lower conductive pattern 140 and the common gate structure 166.

The common gate structure 166 may include a gate insulation layer pattern 160, a gate electrode 162, and a capping insulation pattern 164.

The gate insulation layer pattern 160 may be formed conformally on a sidewall of the first recess 126 and an upper surface of the lower conductive pattern 140. The lower conductive pattern 140 and the gate electrode 162 may be insulated from each other by the gate insulation layer pattern 160.

In example embodiments, the gate insulation layer pattern 160 may include silicon oxide. In some example embodiments, the gate insulation layer pattern 160 may include a metal oxide. The metal oxide may include, e.g., hafnium oxide, zirconium oxide, titanium oxide, or the like.

The gate electrode 162 may be formed on the gate insulation layer pattern 160, and may partially fill the first recess 126. The gate electrode 162 may include a second barrier metal pattern 162*a* and a second metal pattern 162*b*. The second barrier metal pattern 162*a* may surround sidewalls and a bottom surface of the second metal pattern 162*b*. The gate electrode 162 may serve as a common gate electrode of first and second transistors 200 and 202 in the CMOS inverter circuit.

In example embodiments, the second barrier metal pattern 162*a* may include, e.g., titanium, titanium nitride, tantalum, tantalum nitride, tungsten nitride, tungsten carbonitride, or the like. In example embodiments, the second metal pattern 162*b* may include, e.g., tungsten, aluminum, copper, or the like. For example, the second metal pattern 162*b* may include tungsten.

The capping insulation pattern 164 may be formed on the gate insulation layer pattern 160 and the gate electrode 162, and may fill an upper portion of the first recess 126. The capping insulation pattern 164 may include, e.g., silicon nitride or silicon oxynitride.

In an inner portion of the first semiconductor pattern 130*a*, an N+-type impurity region doped with a high concentration of n-type impurities, a P-type impurity region doped with p-type impurities, and an N+-type impurity region doped with a high concentration of n-type impurities may be sequentially disposed from a top surface of the first semiconductor pattern 130*a* downward. Therefore, the first semiconductor pattern 130*a* and the common gate structure 166 may serve as the first transistor 200. The first transistor 200 may be an N-type transistor. In some cases, N+ regions are doped with a higher concentration of n-type impurities than N regions, and may be used to output a signal to a conductor. Similarly, in some cases, P+ regions are doped with a higher concentration of p-type impurities than P regions, and may be used to output a signal to a conductor.

The N+-type impurity regions may be spaced apart from each other in a vertical direction perpendicular to the surface of the substrate, and the N+-type impurity regions may serve as source/drain regions of the first transistor 200, respectively. The N+-type impurity region positioned at an upper portion of the first semiconductor pattern 130*a* may be referred to as a first impurity region 180*a*, and the N+-type impurity region positioned at a lower portion of the first semiconductor pattern 130*a* may be referred to as a second impurity region 180*c*. The P-type impurity region may serve as a channel region of the first transistor 200, and may be referred to as a first channel region 180*b*.

In example embodiments, a bottom of the first impurity region 180*a* may have the same height as a bottom of the capping insulation pattern 164. In some embodiments, the bottom of the first impurity region 180*a* may be lower than the bottom of the capping insulation pattern 164. In example embodiments, an upper surface of the second impurity region 180*c* may have the same height as a bottom of the common gate structure 166. In some embodiments, the upper surface of the second impurity region 180*c* may be higher than the bottom of the common gate structure 166.

In example embodiments, the first channel region 180*b* may face the gate electrode 162 of the common gate structure 166.

In an inner portion of the second semiconductor pattern 130*b*, a P+-type impurity region doped with a high concentration of P-type impurities, an N-type impurity region doped with n-type impurities, and a P+-type impurity region doped with a high concentration of P-type impurities may be sequentially disposed from a top surface of the second semiconductor pattern 130*b* downward. Accordingly, the second semiconductor pattern 130*b* and the common gate structure 166 may serve as the second transistor 202. The second transistor 202 may be a P-type transistor. For example, vertical channel transistors (i.e., the first and second transistors) having different conductivity types may be disposed at both sides of the common gate structure 166, and the vertical channel transistors may share the common gate structure 166.

The P+ type impurity regions may be spaced apart from each other in the vertical direction, and may serve as source/drain regions of the second transistor 202, respectively. The P+-type impurity region positioned at an upper portion of the second semiconductor pattern 130*b* may be referred to as a third impurity region 184*a*, and the P+-type impurity region positioned at a lower portion of the second semiconductor pattern 130*b* may be referred to as a fourth impurity region 184*c*. The N-type impurity region may serve as a channel region of the second transistor 202, and may be referred to as a second channel region 184*b*.

In example embodiments, a bottom of the third impurity region 184*a* may have the same height as the bottom of the capping insulation pattern 164. In some example embodiments, the bottom of the third impurity region 184*a* may be lower than the bottom of the capping insulation pattern 164. In example embodiments, an upper surface of the fourth impurity region 184*c* may have the same height as the bottom surface of the common gate structure 166. In some example embodiments, the upper surface of the fourth impurity region 184*c* may be higher than the bottom of the common gate structure 166.

In example embodiments, the second channel region 184*b* may face the gate electrode 162 of the common gate structure 166.

A left sidewall and a right sidewall of the lower conductive pattern 140 may contact the second impurity region 180*c* and the fourth impurity region 184*c*, respectively. Thus, the second impurity region 180*c* and the fourth impurity region 184*c* may be electrically connected to each other by the lower conductive pattern 140. Accordingly, the first and second transistors 200 and 202 may be electrically connected to each other.

Structures shown in FIGS. 1 and 2 may form the CMOS inverter circuit shown in FIG. 3.

Referring to FIGS. 1 to 3, a power supply voltage Vdd may be applied to the third impurity region 184*a* of the second transistor 202. The first impurity region 180*a* of the first transistor 200 may be maintained at a ground level voltage GND.

Since the gate electrode 162 of the common gate structure 166 may serve as a common gate electrode of the first and second transistors 200 and 202, the gate electrode 162 may be provided as an input terminal Vin of the CMOS inverter circuit. Since the lower conductive pattern 140 may be electrically connected to both the second impurity region 180*c* of the first transistor 200 and the fourth impurity region 184*c* of the second transistor 202, the lower conductive pattern 140 may be provided as an output terminal Vout of the CMOS inverter circuit. Accordingly, the semiconductor device including the CMOS inverter circuit may receive an input voltage, and invert the input voltage to output an output voltage.

As described above, two vertical channel transistors having different conductivity types may be formed at both sides of the common gate structure 166. Therefore, the semiconductor device including the CMOS inverter circuit may be formed on the lower substrate having a small horizontal area, and have increased space utilization.

Figure 4:
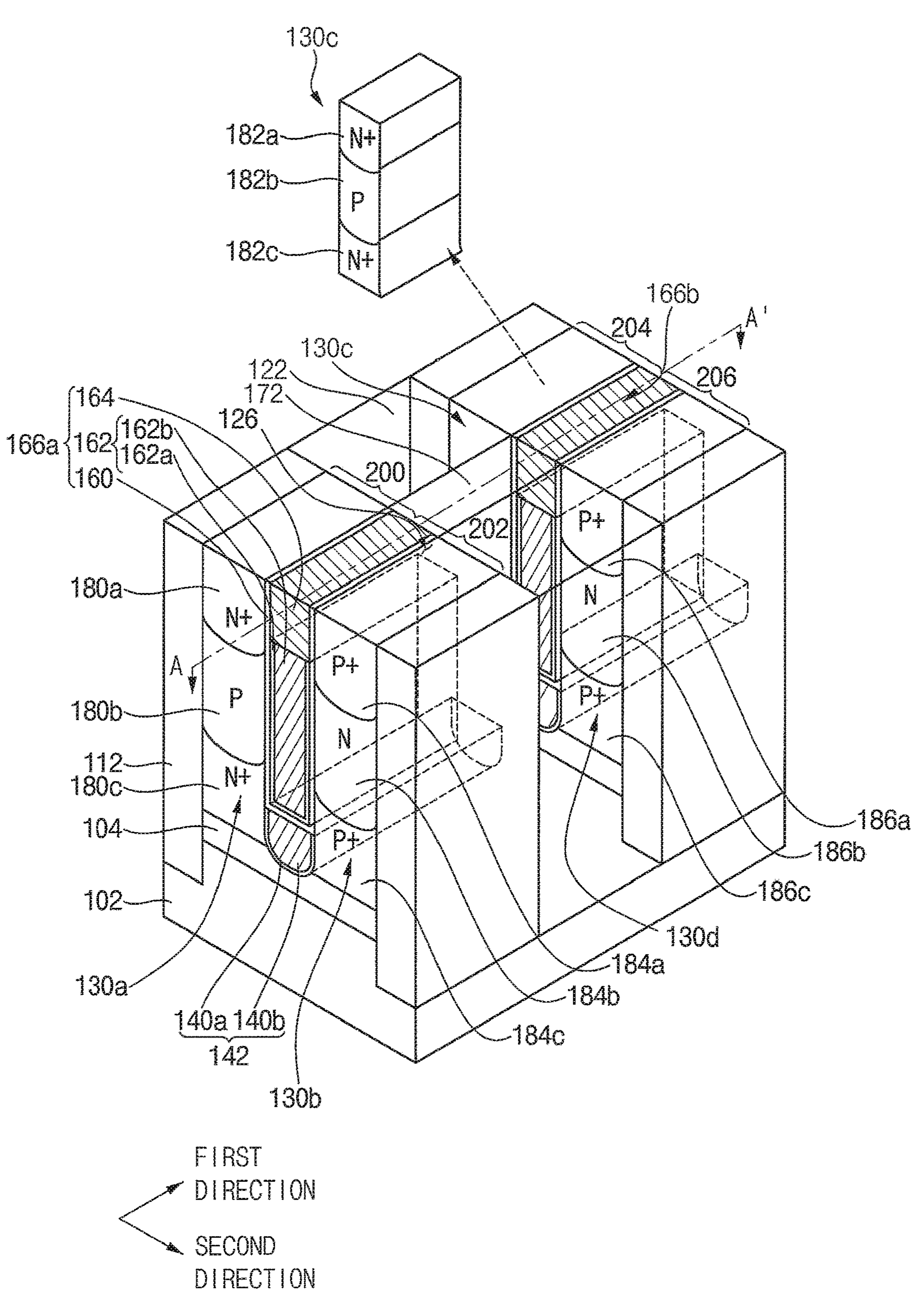
Figure 5:
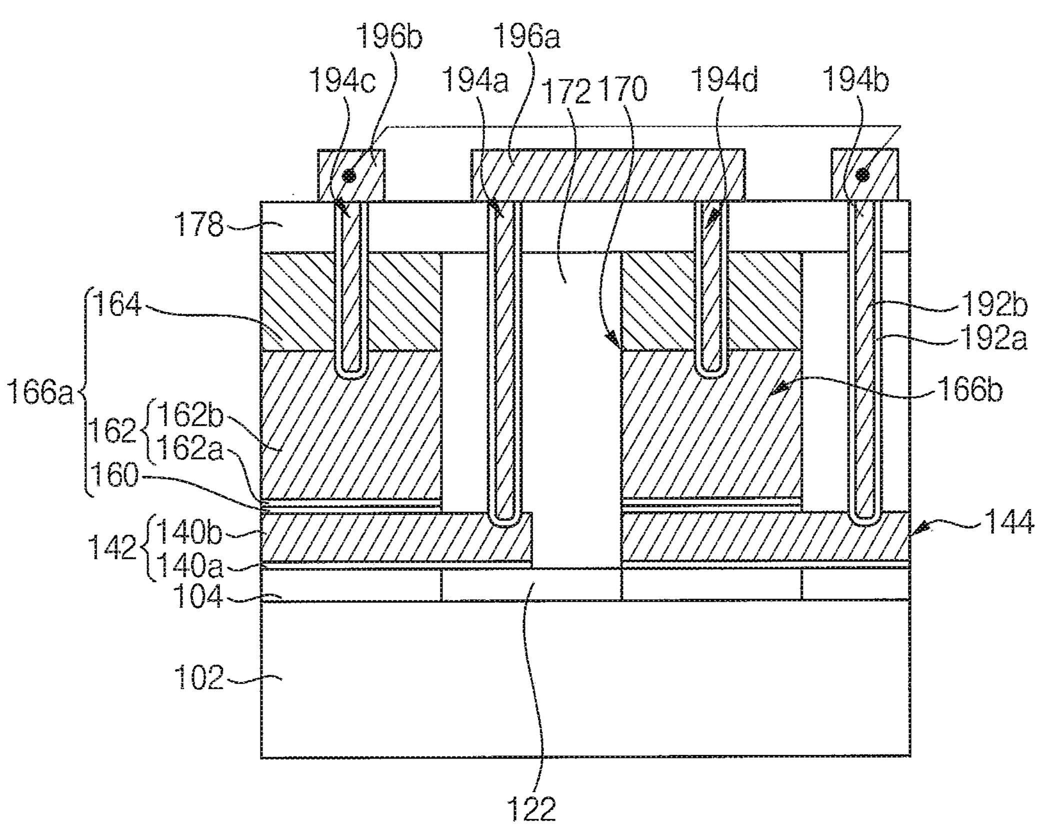
Figure 6:
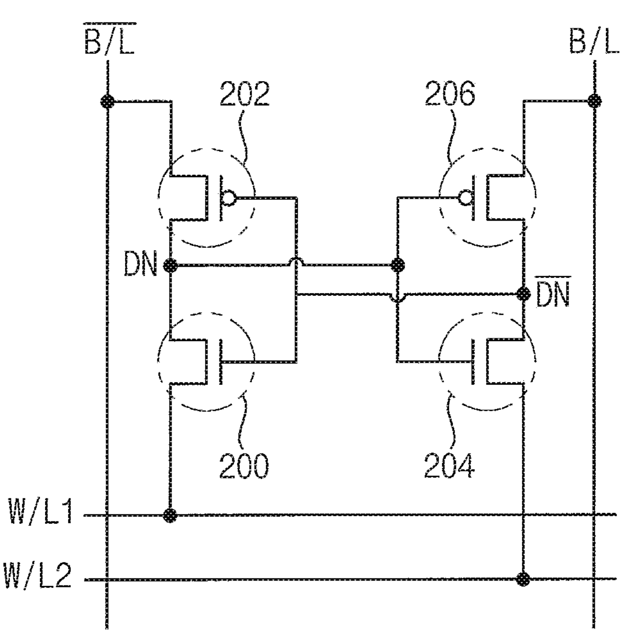

FIG. 4 is a perspective view of a semiconductor device in accordance with example embodiments. FIG. 5 is a cross-sectional view of the semiconductor device shown in FIG. 4. FIG. 6 is a circuit diagram corresponding to the semiconductor device shown in FIG. 4.

The semiconductor device shown in FIGS. 4 to 6 may be one memory cell including CMOS inverter circuits. The memory cell may have a latch structure including two CMOS inverter circuits. The latch structure included in the memory cell will be described with reference to the perspective view of FIG. 4 and the cross-sectional view of FIG. 5.

To avoid obfuscating several components in the drawings, upper wirings electrically connected to the transistors are not illustrated in FIG. 4. These upper wirings are illustrated in FIG. 5, which is a cross-sectional view taken along line A-A' of FIG. 4.

Referring to FIGS. 4 to 6, the semiconductor device may include two CMOS inverter circuits described with reference to FIG. 1. The two CMOS inverter circuits may be spaced apart from each other in the first direction. Each of CMOS inverter circuits may be electrically connected to each other by contact plugs and conductive lines.

In some embodiments, the semiconductor device may be formed on a substrate, and the substrate may be a silicon-on-insulator (SOI) substrate or a germanium-on-insulator (GOI) substrate. For example, the substrate may include the lower substrate 102/the buried insulation layer pattern 104 and the patterned upper semiconductor layer.

The substrate may include first and second semiconductor patterns 130*a* and 130*b* for forming first and second transistors 200 and 202, respectively, and third and fourth semiconductor patterns 130*c* and 130*d* for forming third and fourth transistors 204 and 206, respectively. The first through fourth semiconductor patterns 130*a*, 130*b*, 130*c*, and 130*d* may be formed by etching of the upper semiconductor layer. The first through fourth semiconductor patterns 130*a*, 130*b*, 130*c*, and 130*d* may be formed on the buried insulation layer pattern 104.

The first and second semiconductor patterns 130*a* and 130*b* may be spaced apart from each other in a second direction perpendicular to the first direction, and may face to each other. The third and fourth semiconductor patterns 130*c* and 130*d* may be spaced apart from each other in the second direction, and may face to each other.

A first recess 126 extending in the first direction may be formed between the first and second semiconductor patterns 130*a* and 130*b* and between the third and fourth semiconductor patterns 130*c* and 130*d*. In some embodiments, the first recess 126 forms a channel that aligns the first and second semiconductor patterns 130*a* and 130*b* with the third and fourth semiconductor patterns 130*c* and 130*d* in the first direction. An upper portion of the buried insulation layer pattern 104 may be exposed by a bottom of the first recess 126.

Isolation patterns 112 may extend downward from an upper surface of the substrate. The isolation patterns 112 may be formed at one side of each of the first through fourth semiconductor patterns 130*a*, 130*b*, 130*c*, and 130*d*.

A first lower conductive pattern 142 and a first common gate structure 166*a* may be formed in the first recess 126 between the first and second semiconductor patterns 130*a* and 130*b*. A structure including the first lower conductive pattern 142 and the first common gate structure 166*a* may be substantially the same as the structure including the lower conductive pattern and the common gate structure described with reference to FIGS. 1 to 3. This structure may be shared across the first through fourth semiconductor patterns 130*a*, 130*b*, 130*c*, and 130*d*. For example, the first lower conductive pattern 142 may include the first barrier metal pattern 140*a* and the first metal pattern 140*b*. The first common gate structure 166*a* may include the gate insulation layer pattern 160, the gate electrode 162, and the capping insulation pattern 164.

In example embodiments, the first common gate structure 166*a* may extend in the first direction to an end portion of the first recess 126 between the first and second semiconductor patterns 130*a* and 130*b*. One end of the first lower conductive pattern 142 may protrude in the first direction from one end of the first common gate structure 166*a*. A protruding portion of the first lower conductive pattern 142 may serve as a contact formation region. This is readily apparent from the illustration of FIG. 5.

In an inner portion of the first semiconductor pattern 130*a*, an N-type impurity region, a P-type impurity region, and an N-type impurity region may be sequentially disposed from a top surface of the first semiconductor pattern 130*a*. The N-type impurity region, the P-type impurity region, and the N-type impurity region in the first semiconductor pattern 130*a* may be referred to as a first impurity region 180*a*, a first channel region 180*b*, and a second impurity region 180*c*, respectively. The first impurity region and the second impurity region may be doped with a high concentration of N-type impurities. Thus, the first semiconductor pattern 130*a* and the first common gate structure 166*a* may serve as a first transistor 200, an N-type transistor.

In an inner portion of the second semiconductor pattern 130*b*, a P-type impurity region, an N-type impurity region, and a P-type impurity region may be sequentially disposed from a top surface of the second semiconductor pattern 130*b*. The P-type impurity region, the N-type impurity region, and the P-type impurity region in the second semiconductor pattern 130*b* may be referred to as a third impurity region 184*a*, a second channel region 184*b*, and a fourth impurity region 184*c*, respectively. The third impurity region and the fourth impurity region may be doped with a high concentration of P-type impurities. Thus, the second semiconductor pattern 130*b* and the first common gate structure 166*a* may serve as a second transistor 202, a P-type transistor.

The third transistor 204 formed at the third semiconductor pattern 130*c* may have substantially the same structure as the first transistor 200 formed at the first semiconductor pattern 130*a*. The fourth transistor 206 formed at the fourth semiconductor pattern 130*d* may substantially the same structure as the second transistor 202 formed at the second semiconductor pattern 130*b*.

For example, a second lower conductive pattern 144 and a second common gate structure 166*b* may be formed in the first recess 126 between the third and fourth semiconductor patterns 130*c* and 130*d*. A structure including the second lower conductive pattern 144 and the second common gate structure 166*b* may be substantially the same as the structure including the lower conductive pattern and the common gate structure described with reference to FIGS. 1 to 3, respectively.

For example, the second lower conductive pattern 144 may include the first barrier metal pattern 140*a* and the first metal pattern 140*b*. The second common gate structure 166*b* may include the gate insulation layer pattern 160, the gate electrode 162, and the capping insulation pattern 164.

In example embodiments, the second common gate structure 166*b* may extend in the first direction to an end portion of the first recess 126 between the third and fourth semiconductor patterns 130*c* and 130*d*. One end of the second lower conductive pattern 144 may protrude in the first direction from one end of the second common gate structure 166*b*. A protruding portion of the second lower conductive pattern 144 may serve as a contact formation region. This is apparent from the illustration in FIG. 5.

In an inner portion of the third semiconductor pattern 130*c*, an N-type impurity region, a P-type impurity region, and an N-type impurity region may be sequentially disposed from a top surface of the third semiconductor pattern 130*c*. The N-type impurity region, the P-type impurity region, and the N-type impurity region in the third semiconductor pattern 130*c* may be referred to as a fifth impurity region 182*a*, a third channel region 182*b*, and a sixth impurity region 182*c*, respectively. The fifth impurity region and the sixth impurity region are doped with a high concentration of N-type impurities. Thus, the third semiconductor pattern 130*c* and the second common gate structure 166*b* may serve as a third transistor 204, an N-type transistor.

In an inner portion of the fourth semiconductor pattern 130*d*, a P-type impurity region, an N-type impurity region, and a P-type impurity region may be sequentially disposed from a top surface of the fourth semiconductor pattern 130*d*. The P-type impurity region, the N-type impurity region, and the P-type impurity region in the fourth semiconductor pattern 130*d* may be referred to as a seventh impurity region 186*a*, a fourth channel region 186*b*, and an eighth impurity region 186*c*, respectively. The seventh impurity region and the eighth impurity region may be doped with a high concentration of P-type impurities. Thus, the fourth semiconductor pattern 130*d* and the second common gate structure 166*b* may serve as a fourth transistor 206, a P-type transistor.

The first and second semiconductor patterns 130*a* and 130*b* and the first common gate structure 166*a* which constitute the first and second transistors 200 and 202, and third and fourth semiconductor patterns 130*c* and 130*d* and the second common gate structure 166*b* which constitute the third and fourth transistors 204 and 206 may be spaced apart from each other in the first direction. Accordingly, the first and second transistors 200 and 202 and third and fourth transistors 204 and 206 may be electrically separated from each other. A first insulation pattern 122 may fill a space between the first and third semiconductor patterns 130*a* and 130*c* and a space between the second and fourth semiconductor patterns 130*b* and 130*d*. A second insulation pattern 172 may filled a space between the first and second common gate structures 166*a* and 166*b*. The first and second insulation patterns 122 and 172 may include, e.g., silicon oxide. The first and second insulation patterns 122 and 172 may include the same material. In some embodiments, the first and second insulation patterns 122 and 172 constitute one lower insulation pattern. In some embodiments, the first and second insulation patterns 122 and 172 are integrally formed.

An upper insulation layer 178 may be formed on the first through fourth semiconductor patterns 130*a*, 130*b*, 130*c*, and 130*d*, the first and second common gate structures 166*a* and 166*b*, the lower insulation pattern, and the isolation pattern 112. The upper insulation layer 178 may include, e.g., silicon oxide.

A first contact plug 194*a* may pass through the upper insulation layer 178 and the lower insulation pattern, and may contact an upper surface of the first lower conductive pattern 142. A second contact plug 194*b* may pass through the upper insulation layer 178 and the lower insulation pattern, and may contact an upper surface of the second lower conductive pattern 144.

A third contact plug 194*c* may pass through the upper insulation layer 178 and the capping insulation pattern 164, and may contact the gate electrode 162 of the first common gate structure 166*a*. A fourth contact plug 194*d* may pass through the upper insulation layer 178 and the capping insulation pattern 164, and may contact the gate electrode of the second common gate structure 166*b*.

Each of the first through fourth contact plugs 194*a*, 194*b*, 194*c*, and 194*d* may include a third barrier metal pattern and a third metal pattern.

A first connection pattern 196*a* may be electrically connected with the first contact plug 194*a* and the fourth contact plug 194*d*. A second connection pattern 196*b* may be electrically connected with the second contact plug 194*b* and the third contact plug 194*c*. Each of the first and second connection patterns 196*a* and 196*b* may be formed on the upper insulation layer 178.

Accordingly, the gate electrode of the first common gate structure 166*a* may be electrically connected to the second lower conductive pattern 144. The gate electrode of the first common gate structure 166*a* may be electrically connected to the sixth impurity region 182*c* and the eighth impurity region 186*c* of the third and fourth transistors 204 and 206.

Also, the gate electrode of the second common gate structure 166*b* may be electrically connected to the first lower conductive pattern 142. Accordingly, the gate electrode of the second common gate structure 166*b* may be electrically connected to the second impurity region 180*c* and the fourth impurity region 184*c* of the first and second transistors 200 and 202.

In some embodiments, the memory cell may further include a wiring electrically connected to the first impurity region 180*a* of the first transistor 200, a wiring electrically connected to the third impurity region 184*a* of the second transistor 202, a wiring electrically connected to the fifth impurity region 182*a* of the third transistor 204, and a wiring electrically connected to the seventh impurity region 186*a* of the fourth transistor 206.

Accordingly, the memory cell having a latch structure and including the CMOS inverter circuits may be provided.

An example of driving of the memory cell will be briefly described with reference to FIG. 6.

The third impurity region 184*a* of the second transistor 202 may be connected to the bit line bar B/L-bar, and the seventh impurity region 186*a* of the fourth transistor 206 may be connected to the bit line B/L. In addition, the first impurity region 180*a* of the first transistor 200 may be connected to the first word line W/L1, and the fifth impurity region 182*a* of the third transistor 204 may be connected to the second word line W/L2.

Power for the memory cell may be supplied by the bit line and bit line bar B/L and B/L-bar.

In a standby state, each of the bit line B/L and the bit line bar B/L-bar may have a power supply voltage level, and the first and second word lines W/L1 and W/L2 may have a ground level voltage. Data may be stored at a data node DN and the data node bar DN-bar of the memory cell. For example, when the data node DN has a high level, the state may be defined as data value 1, and when the data node DN has a low level, the state may be defined as data value 0.

In an operating state, data may be read or written by applying voltage to the bit line B/L and bit line bar B/L-bar and the first and second word lines W/L1 and W/L2, respectively.

For example, when data value 1 is written, a voltage level of the bit line B/L may be lowered to have a bit line voltage level, and a voltage level of the bit line bar B/L-bar may be raised to have the power supply voltage level. Thereafter, a pulse voltage may be sequentially applied to the first word line W/L1 and the second word line B/L2. When an initial data is data value 0 and the pulse voltage is applied to the first word line W/L1, a level of the data node may be changed to have a high level. On the other hand, when an initial data is data value 1, a level of the data node may be maintained at a high level.

When data value 0 is written, a voltage level of the bit line bar B/L-bar may be lowered to have the bit line voltage level, and a voltage level of the bit line B/L may be raised to have the power supply voltage level. Thereafter, the pulse voltage may be sequentially applied to the first word line W/L1 and the second word line W/L2.

When data is read, a voltage level of the second word line W/L2 may be raised to have a word line voltage level, and currents flowing through the third and fourth transistors 204 and 206 connected to the bit line B/L may be sensed. For example, when data value 1 is stored in a selected memory cell, even if the voltage level of the second word line W/L2 is raised to have the word line voltage level, the second transistor 202 may be turned off. Therefore, currents may not flow through the third and fourth transistors 204 and 206. On the other hand, when data value 0 is stored in a selected memory cell, the voltage level of the second word line W/L2 is raised to have the word line voltage level. Thus, a voltage level the data node DN may be raised through the second transistor 202. Therefore, the third and fourth transistors may be instantaneously and simultaneously turned on, so that currents may flow the third and fourth transistors 204 and 206. By detecting the currents, data stored in the selected memory cell may be read.

Although the memory cell including four transistors has been described with reference to FIGS. 4 and 5, a configuration of the memory cell is not necessarily limited thereto. For example, the memory cells may include six transistors including pass transistors including two NMOS transistors and the CMOS inverter circuits having the latch structure.

FIGS. 7 to 27 are perspective views and cross-sectional views that illustrate a method of manufacturing a semiconductor device in accordance with example embodiments.

Hereinafter, a method of manufacturing the semiconductor device shown in FIGS. 4 and 5 will be described. Each of the cross-sectional views is a cross-sectional view of a portion corresponding to line A-A' of FIG. 7.

Figure 7:
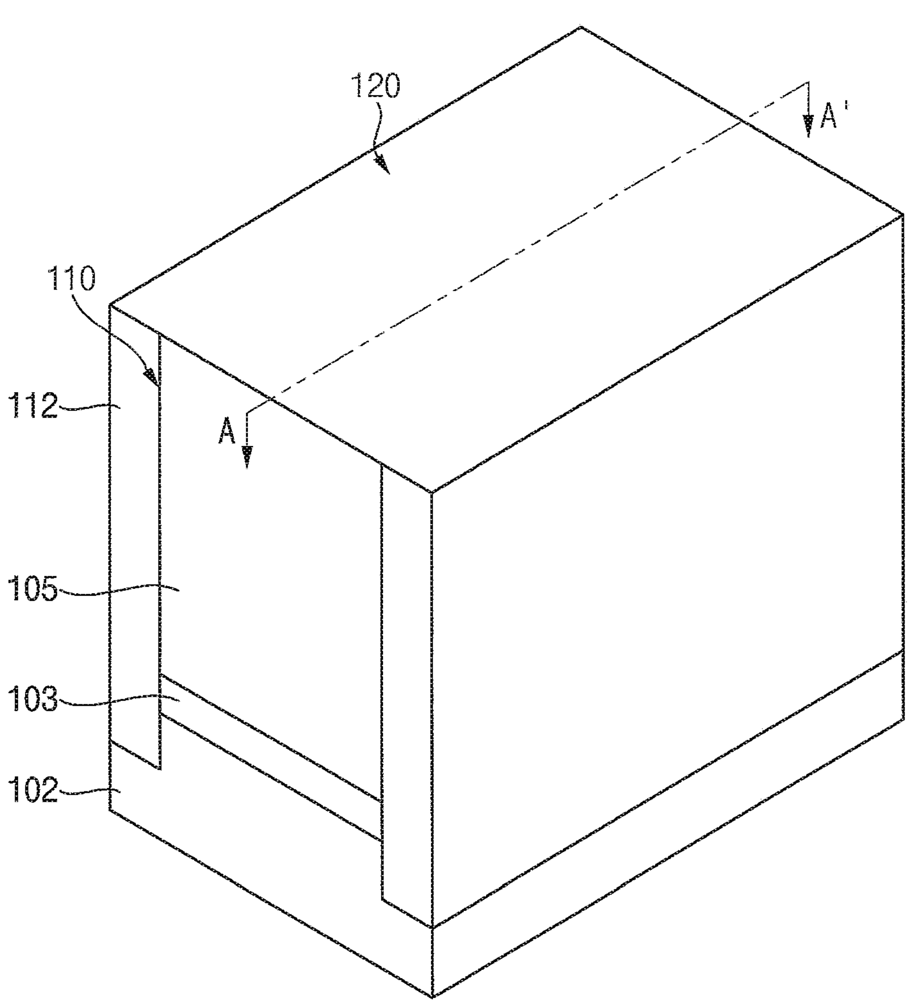
Figure 7:
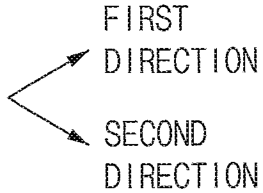
Figure 8:
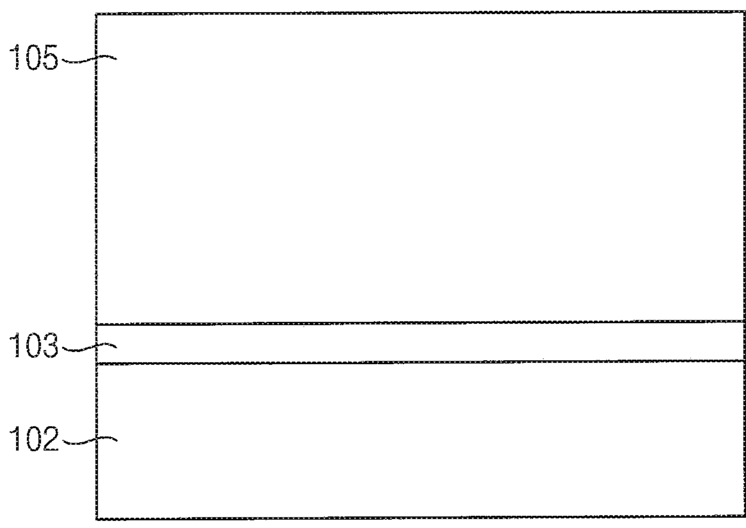

Referring to FIGS. 7 and 8, a substrate may include the lower substrate 102, the buried insulation layer 103, and the upper semiconductor layer 105. The substrate may be a silicon-on-insulator (SOI) substrate or a germanium-on-insulator (GOI) substrate.

In some embodiments, a first mask pattern may be formed on the upper semiconductor layer 105. Portions of the upper semiconductor layer 105, the buried insulation layer 103, and the lower substrate 102 may be anisotropically etched to form first trenches 110.

The first trenches 110 may extend in the first direction. The first trench 110 may serve as an isolation region. Transistors may be formed in the upper semiconductor layer 105 between the first trenches 110 by performing subsequent processes.

An insulation layer may be formed on the upper semiconductor layer 105 to completely fill the first trench 110. An upper surface of the insulation layer may be planarized until an upper surface of the upper semiconductor layer 105 is exposed to form an isolation pattern 112 which fills in each of the first trenches 110.

Figure 9:
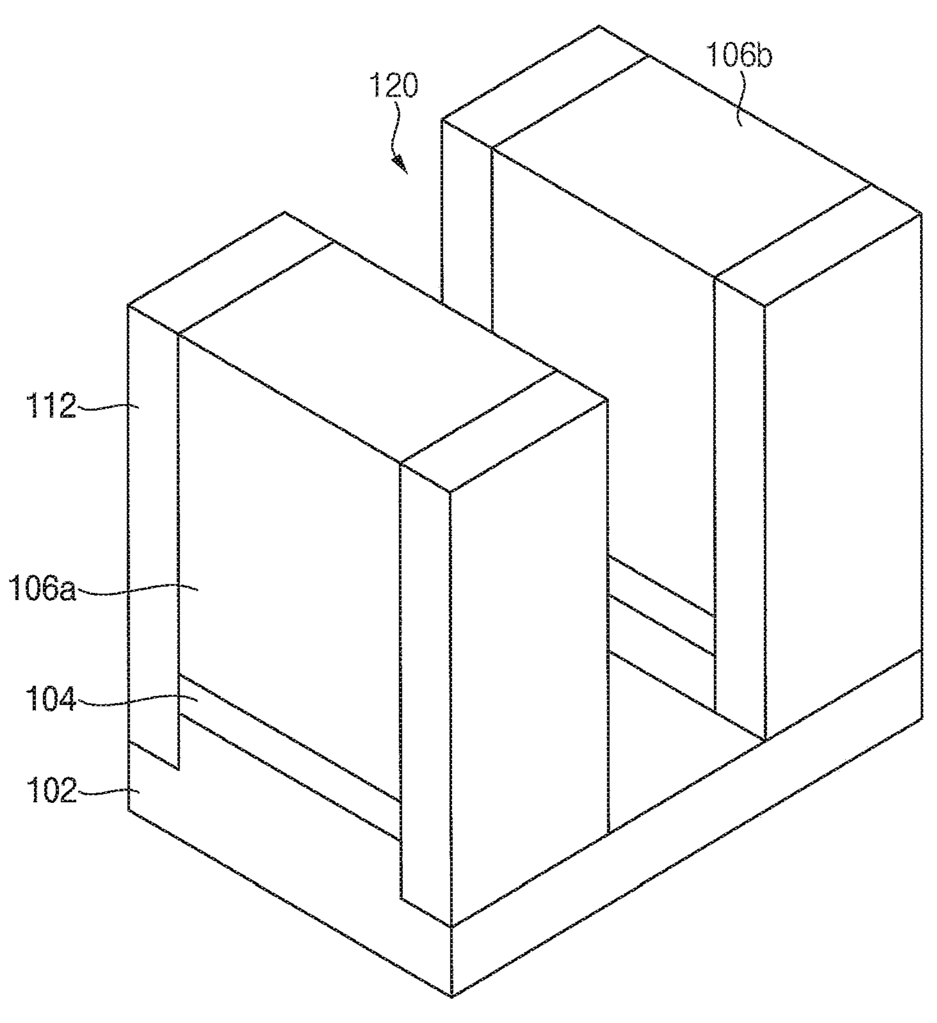
Figure 9:
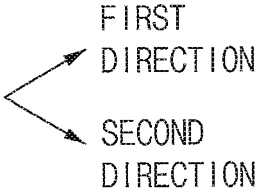
Figure 10:
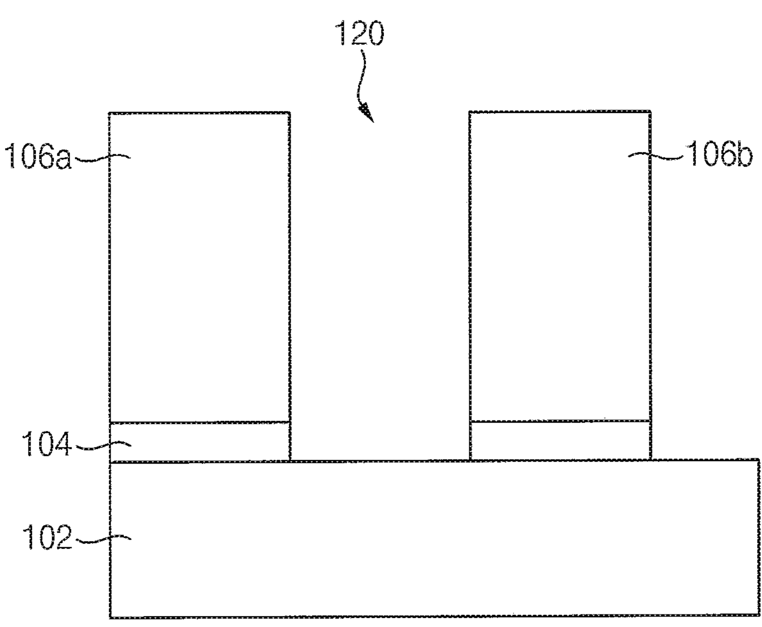

Referring to FIGS. 9 and 10, the upper semiconductor layer 105, the isolation pattern 112, and the buried insulation layer 103 may be etched to form a second trench 120 extending in the second direction perpendicular to the first direction. In example embodiments, a plurality of second trenches 120 may be spaced apart from each other in the first direction. The lower substrate 102 may be exposed by a bottom of the second trench 120. Thus, the buried insulation layer 103 and the upper semiconductor layer 105 may be separated by the second trench 120 to form a plurality of structures in which the buried insulation layer pattern 104 and preliminary upper semiconductor patterns 106*a* and 106*b* are stacked.

Hereinafter, two preliminary upper semiconductor patterns formed at both sides of one second trench 120 may be described. The two preliminary upper semiconductor patterns may be referred to as first and second preliminary upper semiconductor patterns 106*a* and 106*b*, respectively, in an arrangement in the second direction.

Figure 11:
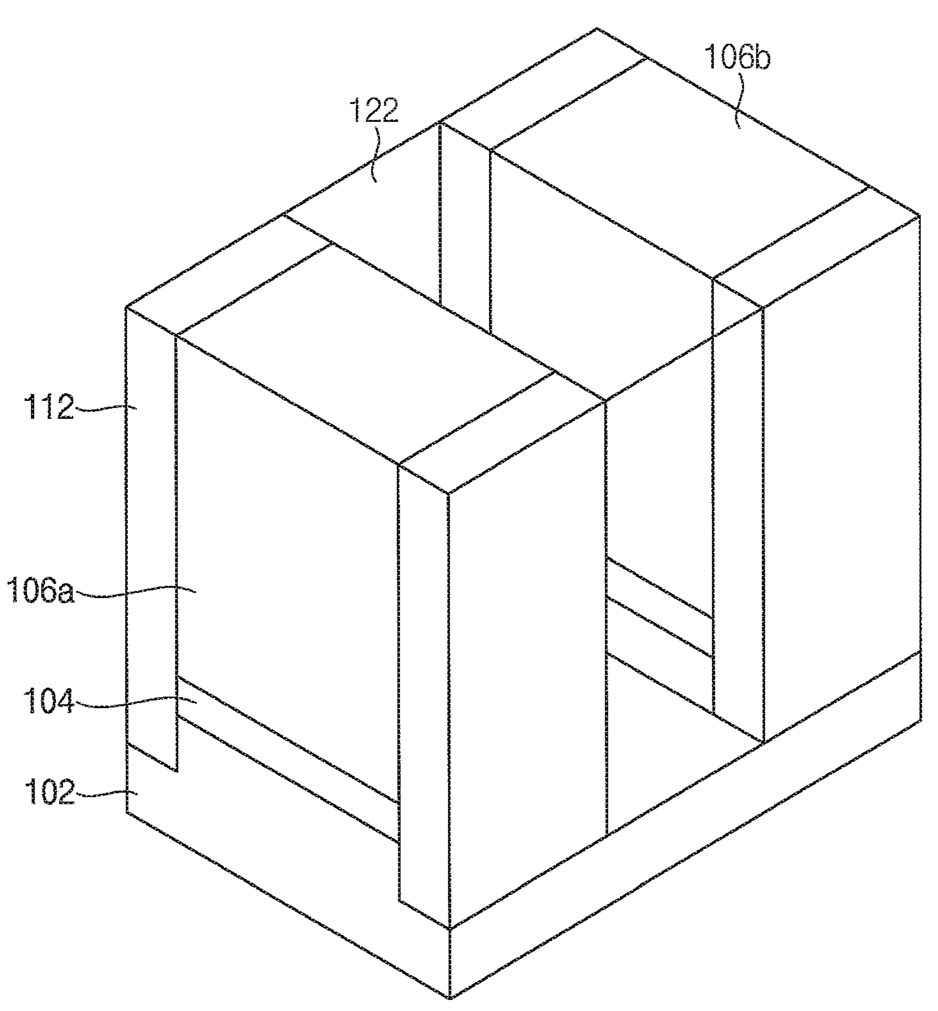
Figure 11:
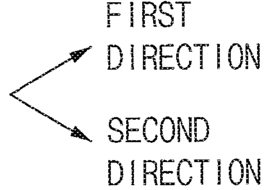
Figure 12:
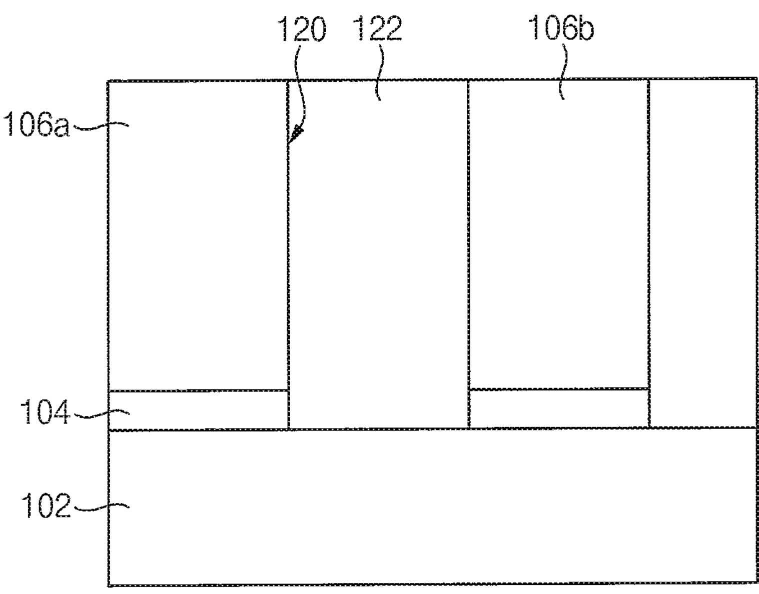

Referring to FIGS. 11 and 12, a first insulation pattern 122 may be formed to fill the second trench 120. In example embodiments, the first insulation pattern 122 may include silicon oxide. Each of the first and second preliminary upper semiconductor patterns 106*a* and 106*b* may be surrounded by the first insulation pattern 122 and the isolation pattern 112.

Figure 13:
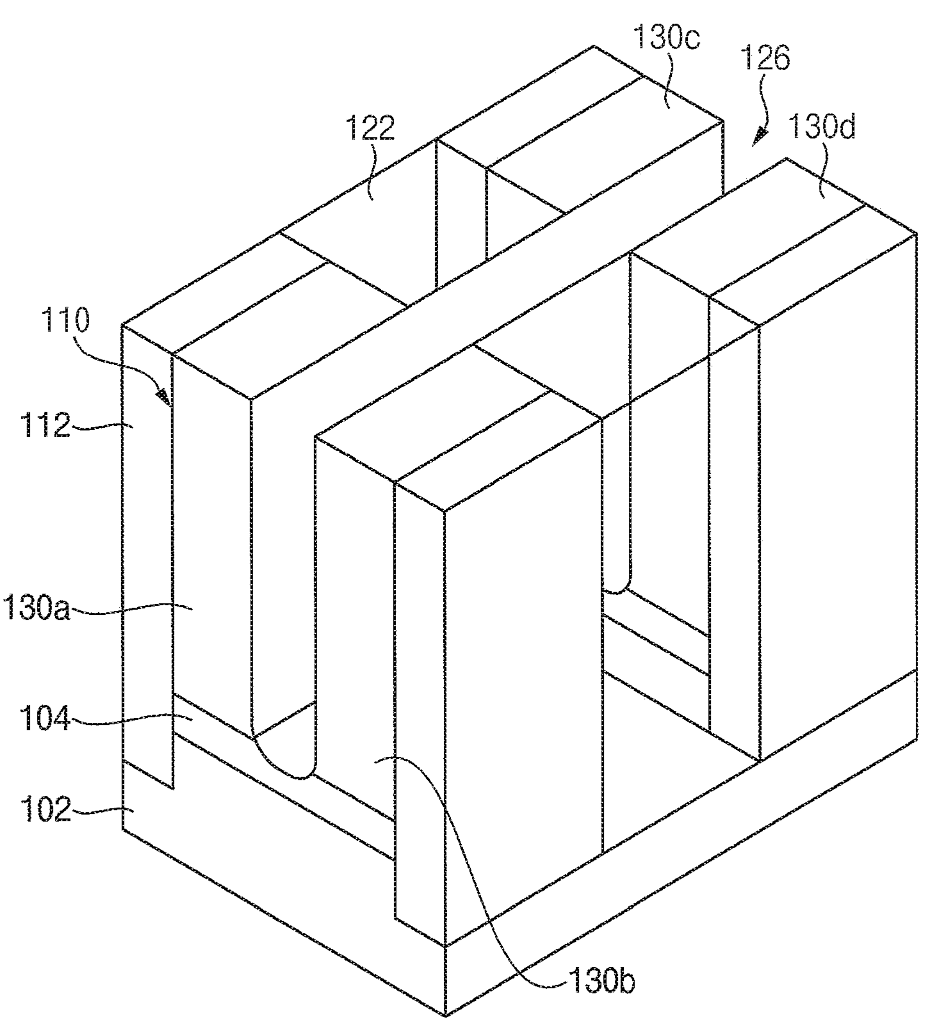
Figure 13:
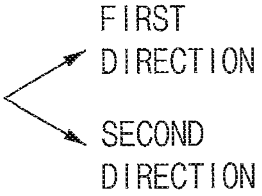
Figure 14:
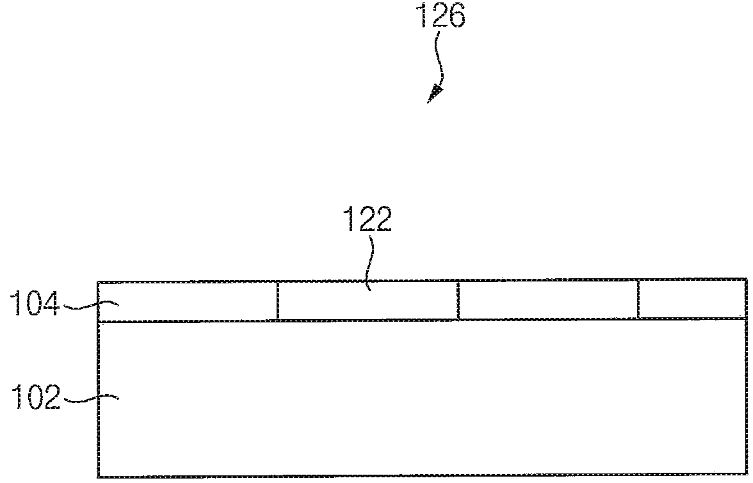

Referring to FIGS. 13 and 14, the first and second preliminary upper semiconductor patterns 106*a* and 106*b* and the first insulation pattern 122 between the isolation patterns 112 may be anisotropically etched to form a first recess 126. The first recess 126 may be spaced apart from the first trench 110 in the second direction, and may extend parallel with the first trench 110 in the first direction. The buried insulation layer pattern 104 and the first insulation pattern 122 may be exposed by a bottom of the first recess 126. For example, the lower substrate 102 may not be exposed by the bottom of the first recess 126, and accordingly only insulation material may be exposed by the bottom of the first recess 126. The buried insulation layer pattern

104 and the first insulation pattern 122 may include the same material, and may be merged with each other to be a single layer.

The first recess 126 may form a channel through the first preliminary upper semiconductor pattern 106*a* to form two sides, and similarly form a channel through the second preliminary upper semiconductor pattern 106*b*. Thus, separated semiconductor patterns may be formed at both sides of the first recess 126, respectively. For example, the first preliminary upper semiconductor pattern 106*a* may be separated to form first and second semiconductor patterns 130*a* and 130*b* at the left and right sides of the first recess 126, respectively. The second preliminary upper semiconductor pattern 106*b* may be separated to form third and fourth semiconductor patterns 130*c* and 130*d* at left and right sides of the first recess 126, respectively.

Figure 15:
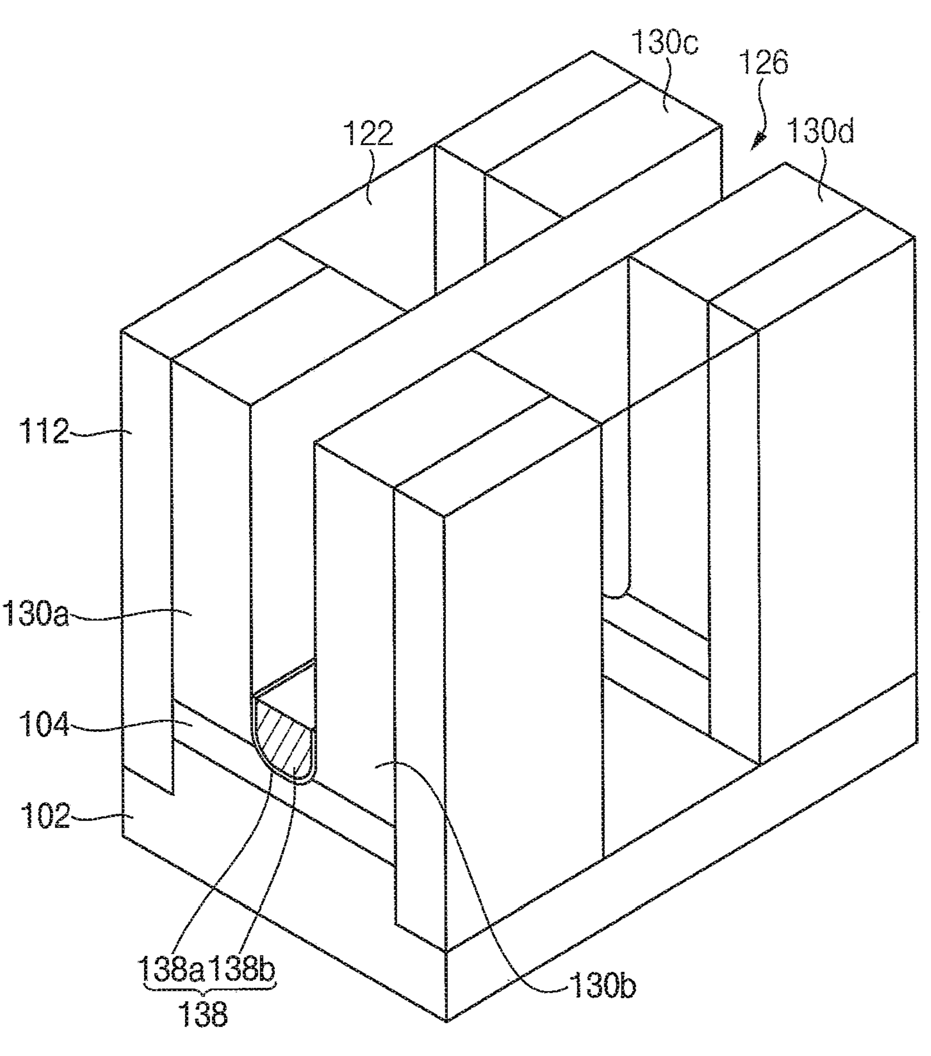
Figure 15:
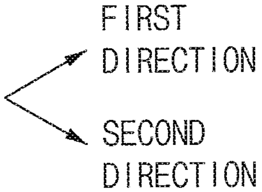
Figure 16:
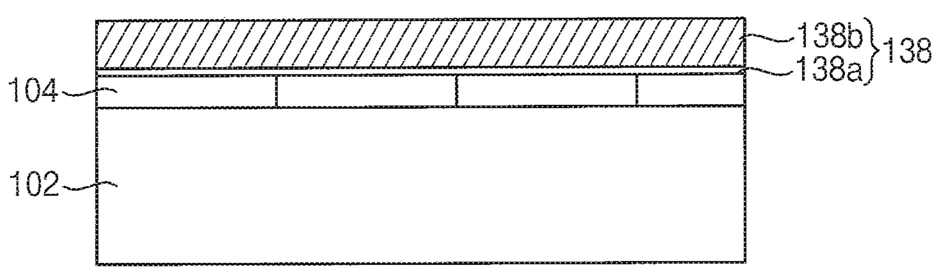

Referring to FIGS. 15 and 16, a first barrier metal layer may be formed conformally on a surface of the first recess 126. A first metal layer may be formed on the first barrier metal layer to fill the first recess 126.

In example embodiments, the first barrier metal layer may include, e.g., titanium, titanium nitride, tantalum, tantalum nitride, tungsten nitride, tungsten carbonitride, or the like. The first metal layer may include, e.g., tungsten, aluminum, copper, or the like. For example, the first metal layer may include tungsten.

Upper portions of the first barrier metal layer and the first metal layer may be removed to form a preliminary lower conductive layer 138 including a preliminary first barrier metal pattern 138*a* and a preliminary first metal pattern 138*b* in a lower portion of the first recess 126. In example embodiments, to remove the upper portions of the first barrier metal layer and the first metal layer, upper surface of the first barrier metal layer and the first metal layer may be planarized by a chemical mechanical polishing process, and then an etch back process of the first barrier metal layer and the first metal layer may be performed.

Figure 17:
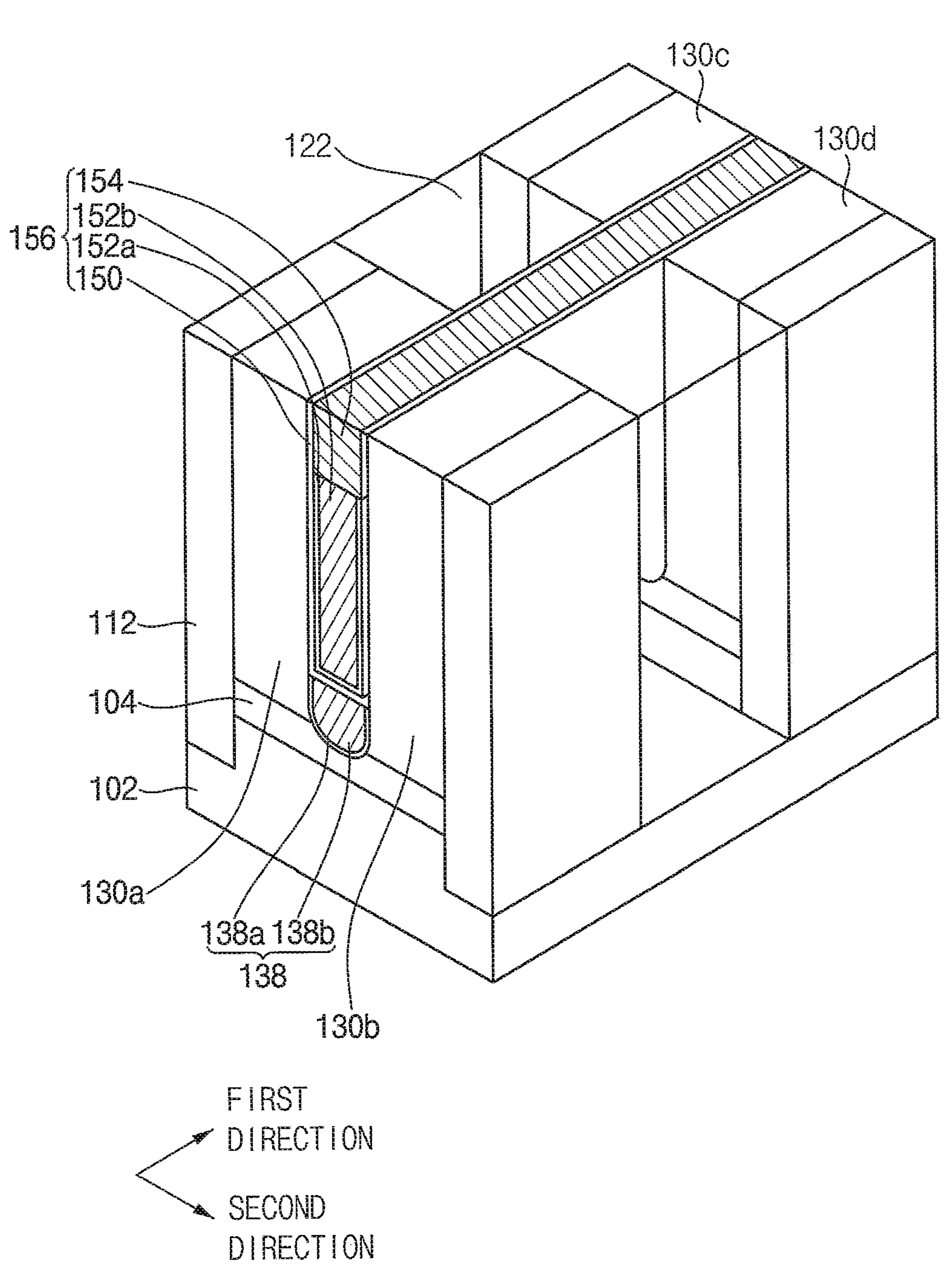
Figure 18:
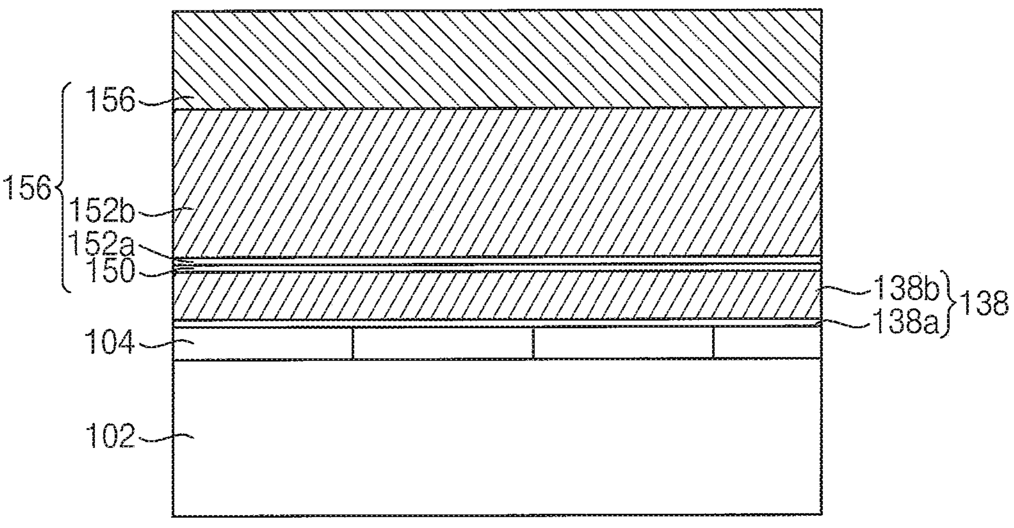

Referring to FIGS. 17 and 18, a preliminary gate insulation layer may be formed conformally on a surface of the first recess 126, the preliminary lower conductive pattern 138, the first through fourth semiconductor patterns 130*a*, 130*b*, 130*c*, 130*d*, the first insulation pattern 122 and the isolation pattern 112. In example embodiments, the preliminary gate insulation layer may include silicon oxide. In some example embodiments, the preliminary gate insulation layer may include a metal oxide. The metal oxide may include, e.g., hafnium oxide, zirconium oxide, titanium oxide, or the like. The metal oxide may be formed by an atomic layer deposition process. In some embodiments, before forming the metal oxide, the surface of the first recess 126 may be thermally oxidized to form a silicon oxide on the first through fourth semiconductor patterns 130*a*, 130*b*, 130*c*, and 130*d* exposed by the first recess 126.

A second barrier metal layer may be formed conformally on the preliminary gate insulation layer. A second metal layer may be formed on the second barrier metal layer to fill the first recess.

In example embodiments, the second barrier metal layer may include, e.g., titanium, titanium nitride, tantalum, tantalum nitride, tungsten nitride, tungsten carbonitride, or the like. The second metal layer may include, e.g., tungsten, aluminum, copper, or the like. For example, the second metal layer may include tungsten.

Upper surfaces of the second metal layer and the second barrier metal layer may be planarized until upper surfaces of the first through fourth semiconductor patterns 130*a*, 130*b*, 130*c*, and 130*d* are exposed. The planarization process may include, e.g., a chemical mechanical polishing (CMP) process. Thereafter, the second metal layer and the second barrier metal layer at an upper portion of the first recess 126 may be partially removed by an etch back process. Accordingly, a preliminary gate insulation layer 150, a second preliminary barrier metal pattern 152*a* and a second preliminary metal pattern 152*b* may be formed in the first recess 126.

Thereafter, a preliminary capping insulation pattern 154 may be formed on the preliminary gate insulation layer 150, the second preliminary barrier metal pattern 152*a* and the second preliminary metal pattern 152*b*. The preliminary capping insulation pattern 154 may be formed in an upper portion of the first recess 126. The preliminary capping insulation pattern 154 may include silicon nitride or silicon oxynitride.

Accordingly, a preliminary gate structure 156 including the preliminary gate insulation layer 150, the second preliminary barrier metal pattern 152*a*, the second preliminary metal pattern 152*b*, and the preliminary capping insulation pattern 154 may be formed in the first recess 126.

Figure 19:
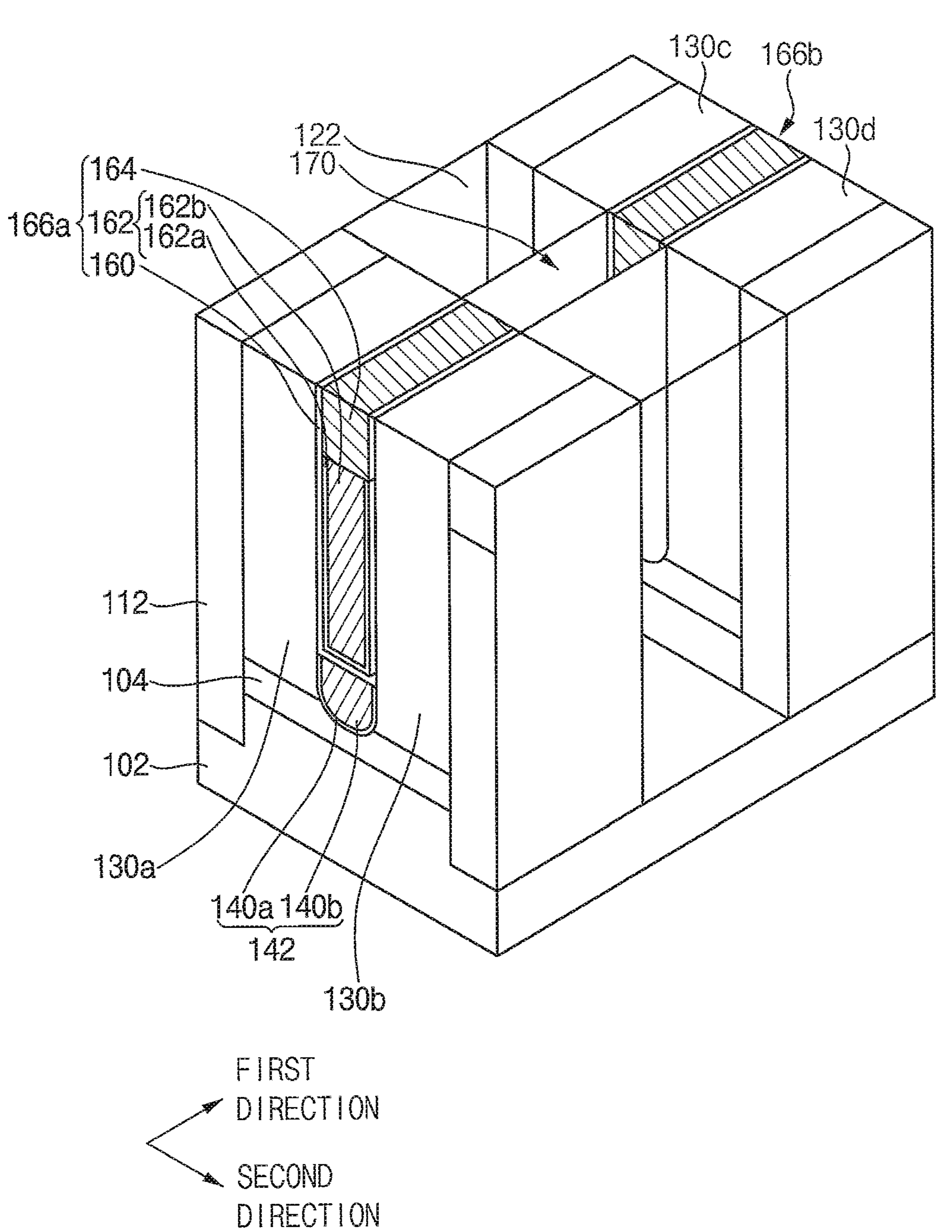
Figure 20:
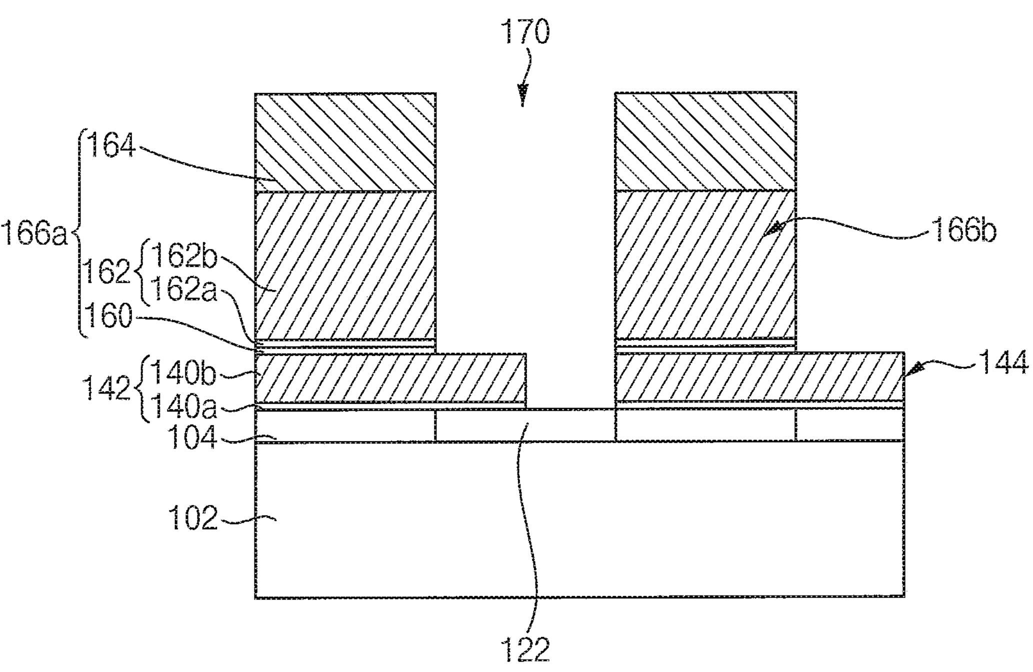

Referring to FIGS. 19 and 20, the preliminary gate structure 156 formed in the second trench 120 may be anisotropically etched to cut the preliminary gate structure 156. Accordingly, each common gate structure including a gate insulation layer pattern 160, a second barrier metal pattern 162*a*, a second metal pattern 162*b*, and the capping insulation pattern 164 may be formed in the first recess 126. The second barrier metal pattern 162*a* and the second metal pattern 162*b* may serve as a gate electrode 162. The common gate structures are referred to as first and second common gate structures 166*a* and 166*b*, respectively, in an arrangement in the first direction.

Thereafter, the preliminary lower conductive pattern 138 positioned at a lower portion of each of the first and second common gate structures 166*a* and 166*b* may be etched to cut the preliminary lower conductive pattern 138. Accordingly, first and second lower conductive patterns 142 and 144 may be formed at lower portions of the first and second common gate structures 166*a* and 166*b*, respectively. As seen in FIG. 20, the first lower conductive pattern 142 may protrude from the first common gate structure 166*a* in the first direction. The second lower conductive pattern 144 may protrude from the second common gate structure 166*b* in the first direction. Accordingly, upper surfaces of the first and second lower conductive patterns 142 and 144 positioned under the first and second common gate structures 166*a* and 166*b* may be exposed. Each of the first and second lower conductive patterns 142 and 144 may include a first barrier metal pattern 140*a* and a first metal pattern 140*b*.

A first opening 170 may be formed in an etched portion, and may separate the first and second lower conductive patterns 142 and 144 and the first and second common gate structures 166*a* and 166*b*.

Figure 21:
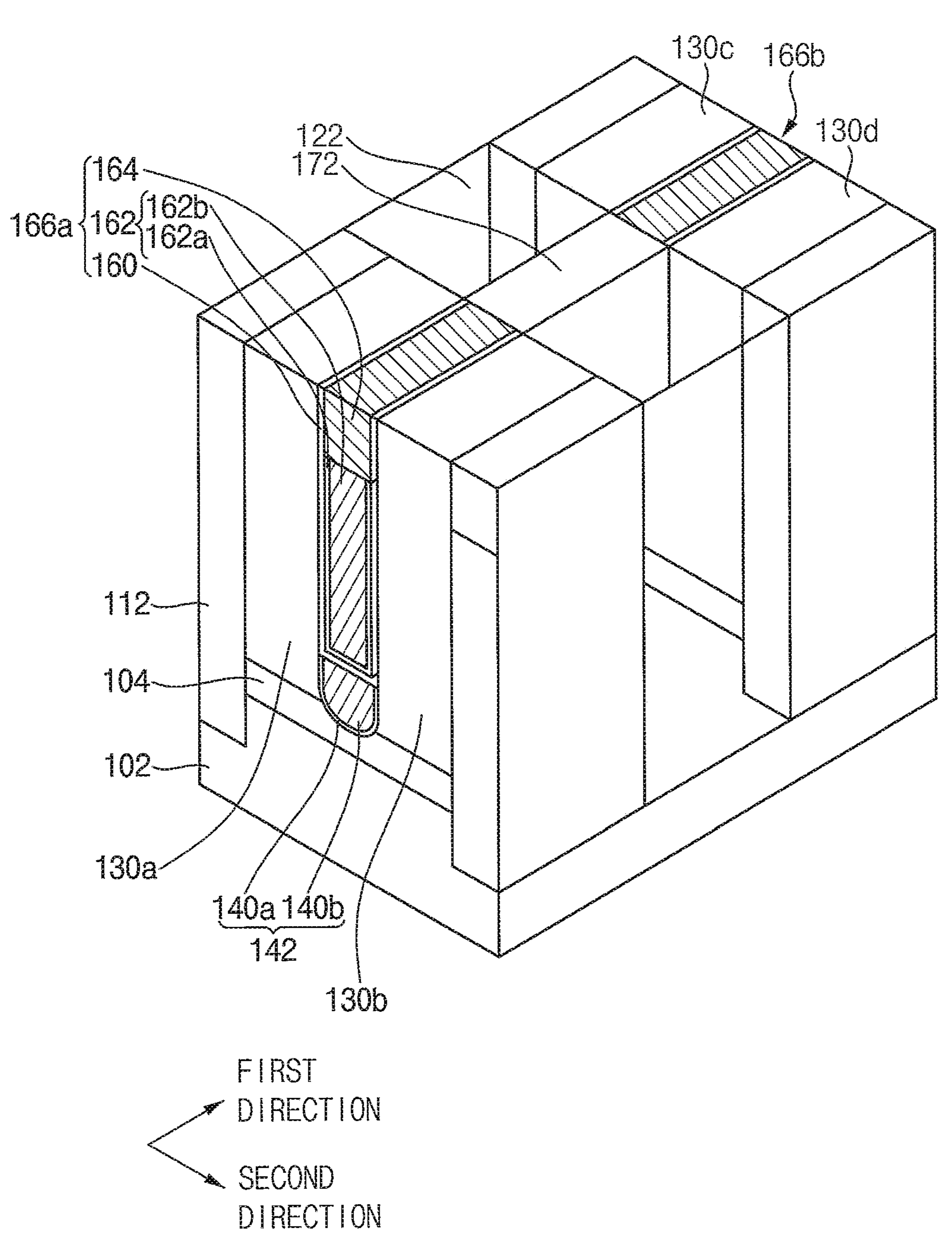
Figure 22:
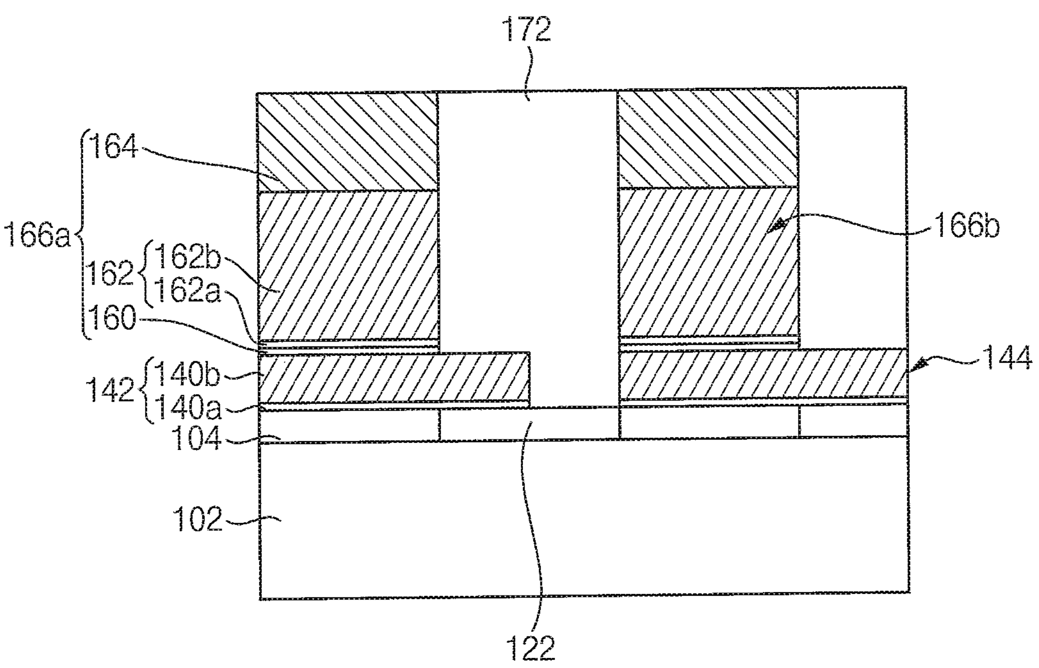

Referring to FIGS. 21 and 22, a second insulation pattern 172 may be formed to fill the first opening 170. The second insulation pattern 172 may include substantially the same material as the material of the first insulation pattern 122. For example, the second insulation pattern 172 may include silicon oxide. Accordingly, the first and second insulation patterns 122 and 172 may be merged to be a lower insulation pattern.

Figure 23:
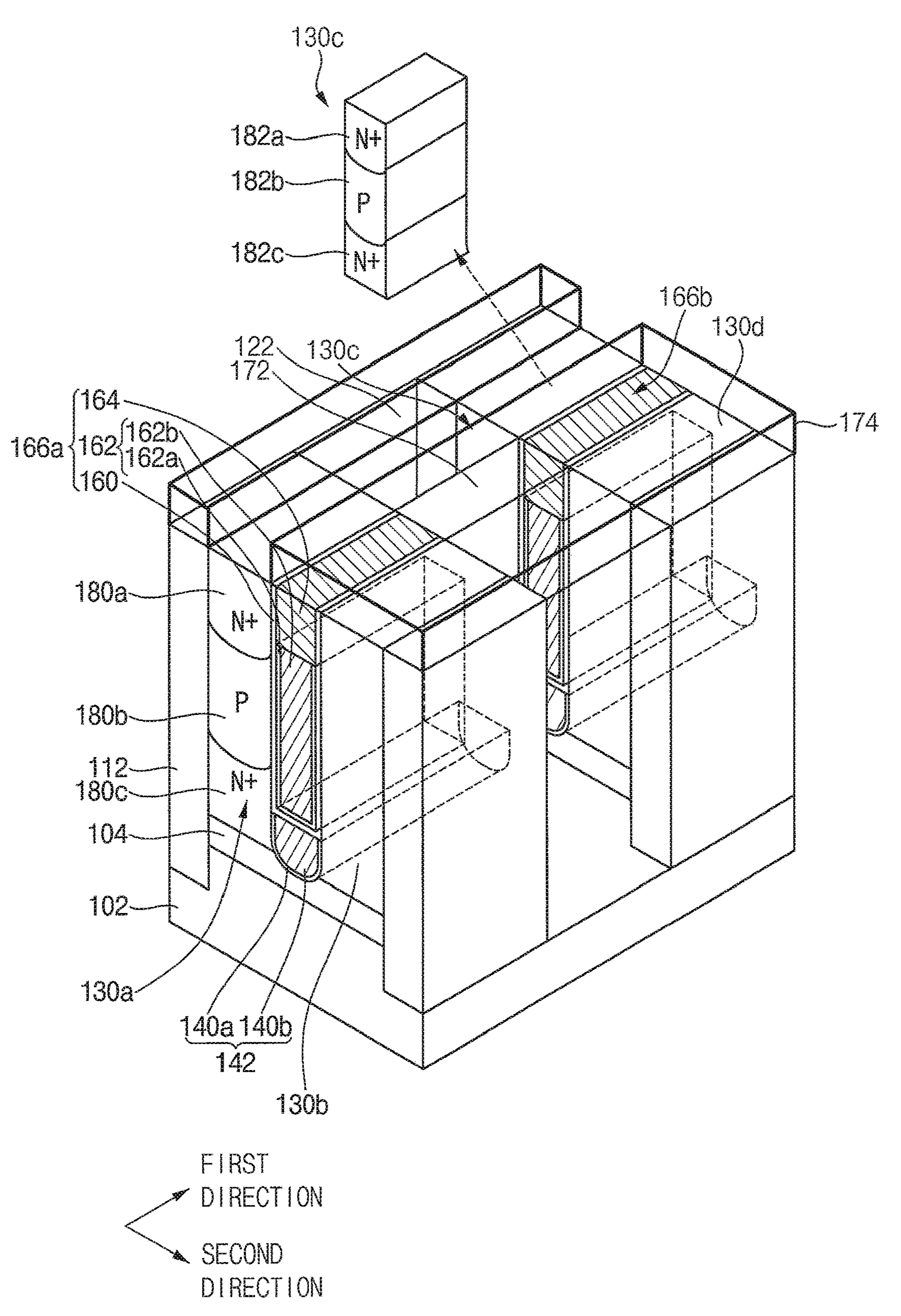

Referring to FIG. 23, a second mask pattern 174 may be formed on the first and second insulation patterns 122 and 172, the isolation pattern 112, first and second common gate structures 166*a* and 166*b*, and the second and fourth semiconductor patterns 130*b* and 130*d*. The second mask pattern 174 may expose upper portions of the first and third semiconductor patterns 130*a* and 130*c*. In example embodiments, an exposed portion of the second mask pattern 174 may have a line shape extending in the first direction.

N-type impurities may be doped into lower portions of the first semiconductor pattern 130*a* and the third semiconductor patterns 130*c* to form a second impurity region 180*c* and a sixth impurity region 182*c*, respectively.

An upper surface of the second impurity region 180*c* may have the same height as a bottom of the first common gate structure 166*a*. In some embodiments, the upper surface of the second impurity region 180*c* is higher than the bottom of the first common gate structure 166*a*. The second impurity region 180*c* may contact the first lower conductive pattern 142, and thus the second impurity region 180*c* may be electrically connected to the first lower conductive pattern 142.

An upper surface of the sixth impurity region 182*c* may have the same height as a bottom of the second common gate structure 166*b*. In some embodiments, the upper surface of the sixth impurity region 182*c* is higher than the bottom of the second common gate structure 166*b*. The sixth impurity region 182*c* may contact the second lower conductive pattern 144, and thus the sixth impurity region 182*c* may be electrically connected to the second lower conductive pattern 144.

P-type impurities may be doped into intermediate portions in the vertical direction of the first and third semiconductor patterns 130*a* and 130*c* to form a first channel region 180*b* on the second impurity region 180*c* and a third channel region 182*b* on the sixth impurity region 182*c*. In example embodiments, the first channel region 180*b* may face the gate electrode 162 of the first common gate structure 166*a*. The third channel region 182*b* may face the gate electrode 162 of the second common gate structure 166*b*.

N-type impurities may be doped into upper portions of the first and third semiconductor patterns 130*a* and 130*c* to form a first impurity region 180*a* in the first channel region 180*b* and a fifth impurity region 182*a* in the third channel region 182*b*. A bottom of the first impurity region 180*a* may have the same height as a bottom of the capping insulation pattern 164 of the first common gate structure 166*a*. In some embodiments, the bottom of the first impurity region 180*a* is lower than the bottom of the capping insulation pattern 164. A bottom of the fifth impurity region 182*a* may have the same height as a bottom of the capping insulation pattern 164 of the second common gate structure 166*b*. In some embodiments, the bottom of the fifth impurity region 182*a* is lower than the bottom of the capping insulation pattern 164.

As described above, impurity doping processes having different doping depths may be performed to form a structure in which the N-type impurity region, the P-type impurity region, and the N-type impurity region are sequentially disposed in each of the first and third semiconductor patterns 130*a* and 130*c*. Therefore, the first and third transistors which are N-type transistors may be formed at the first and third semiconductor patterns 130*a* and 130*c*, respectively.

Thereafter, the second mask pattern 174 may be removed.

Figure 24:
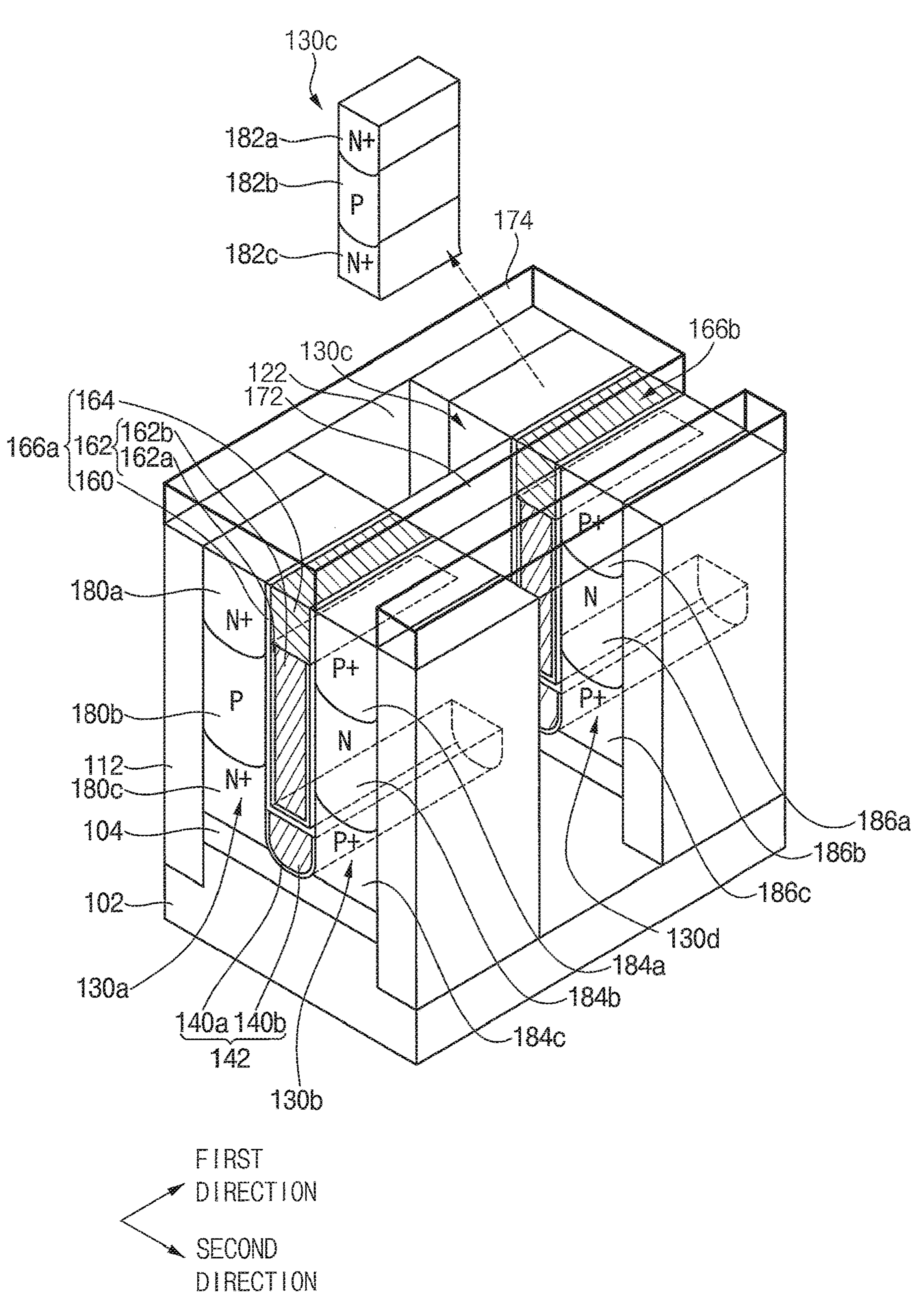

Referring to FIG. 24, a third mask pattern 176 may be formed on the first and second insulation patterns 122 and 172, the isolation pattern 112, the first and second common gate structures 166*a* and 166*b*, and the first and third semiconductor patterns 130*a* and 130*c*. The third mask pattern 176 may expose upper portions of the second and fourth semiconductor patterns 130*b* and 130*d*.

P-type impurities may be doped into lower portions of the second semiconductor pattern 130*b* and the fourth semiconductor patterns 130*d* to form a fourth impurity region 184*c* and an eighth impurity region 186*c*, respectively. An upper surface of the fourth impurity region 184*c* may have the same height as the bottom of the first common gate structure 166*a*. In some embodiments, the upper surface of the fourth impurity region 184*c* is higher than the bottom of the first common gate structure 166*a*. The fourth impurity region 184*c* may contact the first lower conductive pattern 142, and thus the fourth impurity region 184*c* and the second impurity region 180*c* may be electrically connected to each other by the first lower conductive pattern 142.

An upper surface of the eighth impurity region 186*c* may have the same height as a bottom of the second common gate structure 166*b*. In some embodiments, the upper surface of the eight impurity region 186*c* is higher than a bottom of the second common gate structure 166*b*. The eighth impurity region 186*c* may contact the second lower conductive pattern 144, and thus the eighth impurity region 186*c* and the sixth impurity region 182*c* may be electrically connected to each other by the second lower conductive pattern 144.

P-type impurities may be doped into intermediate portions in the vertical direction of the second semiconductor pattern 130*b* and the fourth semiconductor patterns 130*d* to form a second channel region 184*b* on the fourth impurity region 184*c* and a fourth channel region 186*b* on the eighth impurity region 186*c*. In example embodiments, the second channel region 184*b* may face the gate electrode 162 of the first common gate structure 166*a*. The fourth channel region 186*b* may face the gate electrode of the second common gate structure 166*b*.

P-type impurities may be doped into upper portions of the second and fourth semiconductor patterns 130*b* and 130*d* to form a third impurity region 184*a* on the second channel region 184*b* and a seventh impurity region 186*a* on the fourth channel region 186*b*. A bottom of the third impurity region 184*a* may have the same height as the bottom surface of the capping insulation pattern 164 of the first common gate structure 166*a*. In some embodiments, the bottom of the third impurity region 184*a* is lower than the bottom of the capping insulation pattern 164. A bottom of the seventh impurity region 186*a* may have the same height as the bottom of the capping insulation pattern 164 of the second common gate structure 166*b*. In some embodiments, the bottom of the seventh impurity region 186*a* is lower than the bottom of the capping insulation pattern 164.

As described above, impurity doping processes having different doping depths may be performed to form a structure in which the P-type impurity region, the N-type impurity region, and the P-type impurity region are sequentially disposed in each of the second and fourth semiconductor patterns 130*b* and 130*d*. Accordingly, the second and fourth transistors which are P-type transistors may be formed at the second and fourth semiconductor patterns 130*b* and 130*d*, respectively.

Thereafter, the third mask pattern 176 may be removed.

Figure 25:
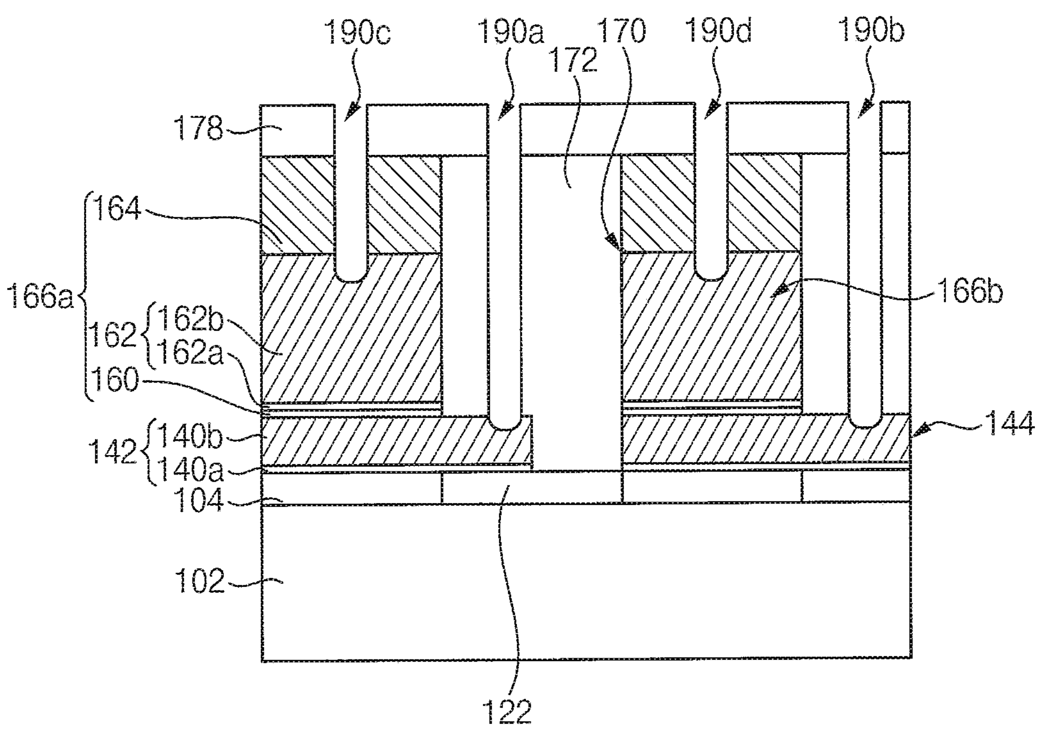

Referring to FIG. 25, an upper insulation layer 178 may be formed to cover the structure formed through the above processes.

Portions of the upper insulation layer 178 and the second insulation pattern 172 may be etched to form a first contact hole 190*a* exposing an upper surface of the first lower conductive pattern 142 under the first common gate structure 166*a*, and to form a second contact hole 190*b* exposing an upper surface of the second lower conductive pattern 144 under the second common gate structure 166*b*.

Thereafter, portions of the upper insulation layer 178 and the capping insulation patterns 164 of the first and second common gate structures 166*a* and 166*b* may be etched to form a third contact hole 190*c* and a fourth contact hole 190*d*. The third contact hole 190*c* may pass through the upper insulation layer 178 and the capping insulation pattern 164 of the first common gate structure 166*a*, and may expose an upper portion of the gate electrode 162. The fourth contact hole 190*d* may pass through the upper insulation layer 178 and the capping insulation pattern of the second common gate structure 166*b*, and may expose an upper portion of the gate electrode 162.

Figure 26:
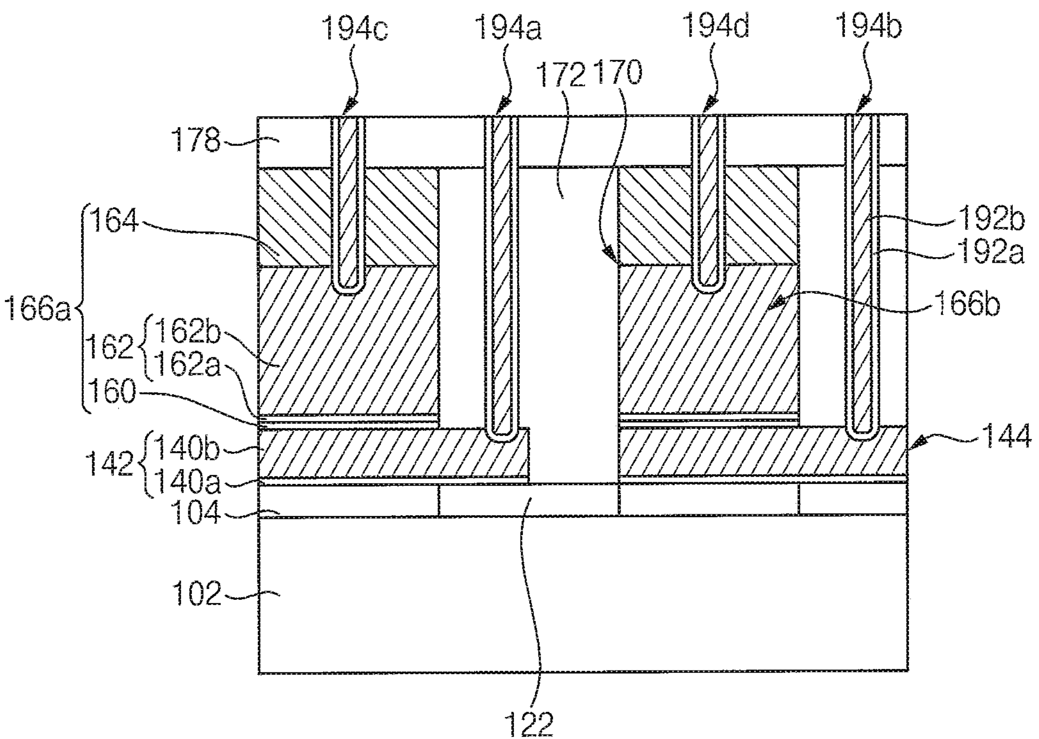

Referring to FIG. 26, a conductive layer may formed in the first through fourth contact holes 190*a*, 190*b*, 190*c*, and 190*d*, and the conductive layer may be planarized to form first through fourth contact plugs 194*a*, 194*b*, 194*c*, and 194*d*, which fill the first through fourth contact holes 190*a*, 190*b*, 190*c*, and 190*d*, respectively. Each of the first through fourth contact plugs 194*a*, 194*b*, 194*c*, and 194*d* may include a third barrier metal pattern 192*a* and a third metal pattern 192*b*.

Figure 27:
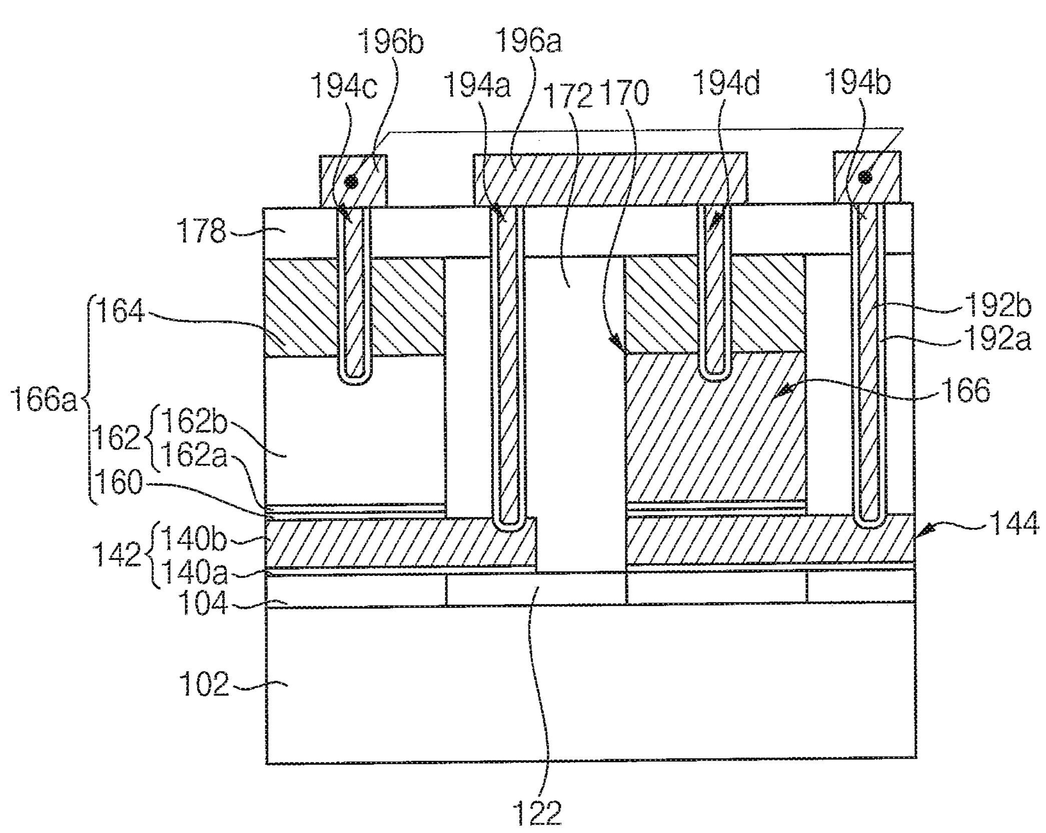

Referring to FIG. 27, a first connection pattern 196*a* may be formed and be electrically connected with the first contact plug 194*a* and the fourth contact plug 194*d*. The second connection pattern 196*b* may be formed and be electrically connected with the second contact plug 194*b* and the third contact plug 194*c*.

In some embodiments, a wiring electrically connected to the first impurity region 180*a* of the first transistor 200, a wiring electrically connected to the third impurity region 184*a* of the second transistor 202, and a wiring electrically connected to the fifth impurity region 182*a* of the third transistor 204 and a wiring electrically connected to the seventh impurity region 186*a* of the fourth transistor 206 may be further formed in the semiconductor device.

Through the above processes, the semiconductor device including the memory cell having a latch structure including two CMOS inverter circuits may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:

a buried insulation layer pattern on a lower substrate;

a first semiconductor pattern and a second semiconductor pattern disposed on the buried insulation layer pattern, the first semiconductor pattern and the second semiconductor pattern extending in a first direction parallel to the lower substrate and spaced apart from each other in a second direction by a first recess, the second direction parallel to the lower substrate and perpendicular to the first direction;

a lower conductive pattern disposed in a lower portion of the first recess between the first and second semiconductor patterns, the lower conductive pattern contacting lower regions of the first and second semiconductor patterns; and a common gate structure disposed on the lower conductive pattern, the common gate structure at least partially filling the first recess, wherein the first semiconductor pattern includes a first impurity region, a first channel region, and a second impurity region in the first semiconductor pattern, the first impurity region, the first channel region, and the second impurity region being sequentially disposed vertically from an upper surface of the first semiconductor pattern, wherein the second semiconductor pattern includes a third impurity region, a second channel region, and a fourth impurity region in the second semiconductor pattern, the third impurity region, the second channel region, and the fourth impurity region sequentially disposed vertically from an upper surface of the second semiconductor pattern, and wherein the first recess includes a curved bottom in the buried insulation layer pattern.

2. The semiconductor device of claim 1, wherein the lower conductive pattern includes a first metal pattern and a first barrier metal pattern which surrounds sidewalls and a bottom surface of the first metal pattern.

3. The semiconductor device of claim 1, wherein the lower conductive pattern contacts the second impurity region and the fourth impurity region.

4. The semiconductor device of claim 1, wherein the common gate structure includes a gate insulation layer pattern, a gate electrode, and a capping insulation pattern.

5. The semiconductor device of claim 4, wherein the gate insulation layer pattern is formed conformally along sidewalls of the first recess and an upper surface of the lower conductive pattern, and the gate electrode is formed on the gate insulation layer pattern.

6. The semiconductor device of claim 4, wherein a bottom of the first impurity region and a bottom of the third impurity region are disposed at the same level as or lower than a bottom the capping insulation pattern, with respect to the lower substrate.

7. The semiconductor device of claim 4, wherein an upper surface of the second impurity region and an upper surface of the fourth impurity region are disposed at the same level as or higher than a bottom of the common gate structure, with respect to the lower substrate.

8. The semiconductor device of claim 4, wherein each of the first and second channel regions are disposed adjacent to the gate electrode.

9. The semiconductor device of claim 1, wherein the first impurity region and the second impurity region are doped with N-type impurities, and the first channel region is doped with P-type impurities.

10. The semiconductor device of claim 9, wherein the third impurity region and the fourth impurity region are doped with a higher concentration of P-type impurities than the first channel region, and the second channel region is doped with an N-type impurities.

11. A semiconductor device, comprising:

a buried insulation layer disposed on a lower substrate;

a first semiconductor pattern and a second semiconductor pattern disposed on the buried insulation layer, the first semiconductor pattern and the second semiconductor pattern extending in a first direction parallel to the lower substrate and spaced apart from each other in a second direction by a first recess, the second direction parallel to the lower substrate and perpendicular to the first direction;

a first lower conductive pattern disposed in a lower portion of the first recess between the first and second semiconductor patterns, the first lower conductive pattern contacting lower regions of the first and second semiconductor patterns;

a first common gate structure disposed on the first lower conductive pattern, the first common gate structure filling a remaining portion of the first recess;

a first impurity region, a first channel region, and a second impurity region in the first semiconductor pattern, the first impurity region, the first channel region, and the second impurity region sequentially disposed from an upper surface of the first semiconductor pattern towards the lower substrate;

a third impurity region, a second channel region, and a fourth impurity region in the second semiconductor pattern, the third impurity region, the second channel region, and the fourth impurity region sequentially disposed from an upper surface of the second semiconductor pattern towards the lower substrate;

a third semiconductor pattern and a fourth semiconductor pattern disposed on the buried insulation layer, the third semiconductor pattern and the fourth semiconductor pattern disposed parallel to the first and second semiconductor patterns, respectively, and respectively spaced apart from the first and second semiconductor patterns in the first direction, and spaced apart from each other by a second recess in the second direction;

a second lower conductive pattern in a lower portion of the second recess between the third and fourth semiconductor patterns, the second lower conductive pattern contacting lower regions of the third and fourth semiconductor patterns;

a second common gate structure disposed on the second lower conductive pattern, the second common gate structure filling a remaining portion of the second recess;

a fifth impurity region, a third channel region, and a sixth impurity region in the third semiconductor pattern, the fifth impurity region, the third channel region, and the sixth impurity region sequentially disposed from an upper surface of the third semiconductor pattern towards the lower substrate;

a seventh impurity region, a fourth channel region, and an eighth impurity region in the fourth semiconductor pattern, the seventh impurity region, the fourth channel region, and the eighth impurity region sequentially disposed from an upper surface of the fourth semiconductor pattern towards the lower substrate;

a first wiring electrically to with the first lower conductive pattern and the second common gate structure; and a second wiring electrically connected to the second lower conductive pattern and the first common gate structure.

12. The semiconductor device of claim 11, wherein the first impurity region, the second impurity region, the fifth impurity region, and the sixth impurity region are doped with N-type impurities, and the first and third channel regions are doped with P-type impurities.

13. The semiconductor device of claim 12, wherein the third impurity region, the fourth impurity region, the seventh impurity region, and the eighth impurity region are doped with a higher concentration of P-type impurities than the first and third channel regions, and the second and fourth channel regions are doped with N-type impurities.

14. The semiconductor device of claim 11, wherein the first lower conductive pattern contacts the second impurity region and the fourth impurity region, and the second lower conductive pattern contacts the sixth impurity region and the eighth impurity region.

15. The semiconductor device of claim 11, wherein one end of the first lower conductive pattern protrudes from one end of the first common gate structure in the first direction, and one end of the second lower conductive pattern protrudes from one end of the second common gate structure in the first direction.

16. The semiconductor device of claim 11, wherein the first common gate structure includes a first gate insulation layer pattern, a first gate electrode, and a first capping insulation pattern, and the second common gate structure includes a second gate insulation layer pattern, a second gate electrode, and a second capping insulation pattern.

17. The semiconductor device of claim 16, wherein the first wiring includes a first contact plug contacting the first lower conductive pattern, a second contact plug contacting the second gate electrode, and a first connection pattern which electrically connects the first and second contact plugs.

18. The semiconductor device of claim 16, wherein the second wiring includes a third contact plug contacting the second lower conductive pattern, a fourth contact plug contacting the first gate electrode, and a second connection pattern which electrically connects the third and fourth contact plugs.

19. A semiconductor device, comprising:

a buried insulation layer pattern on a lower substrate;

a first semiconductor pattern extending in a first direction parallel to the lower substrate and including an N-type upper impurity region, a P-type impurity region and an N-type lower impurity region stacked vertically from an upper surface of the first semiconductor pattern towards the buried insulation layer pattern;

a second semiconductor pattern extending in the first direction and adjacent to the first semiconductor pattern and spaced apart from the first semiconductor pattern in a second direction parallel to the lower substrate, the second semiconductor pattern including a P-type upper impurity region, an N-type impurity region and a P-type lower impurity region stacked vertically from an upper surface of the second semiconductor pattern towards the buried insulation layer pattern;

a lower conductive pattern disposed in a space between the first and second semiconductor patterns, the lower conductive pattern electrically connecting to the P-type lower impurity region and the N-type lower impurity region; and a common gate structure disposed on the lower conductive pattern, the common gate structure filling a remaining space between the first and second semiconductor patterns;

wherein the common gate structure includes a gate insulation layer pattern, a gate electrode, and a capping insulation pattern, and wherein the gate electrode and the lower conductive pattern are insulated from each other by the gate insulation layer pattern, and wherein the space between the first and second semiconductor patterns includes a curved bottom in the buried insulation layer pattern.

20. The semiconductor device of claim 19, wherein the P-type impurity region of the first semiconductor pattern and the N-type impurity region of the second semiconductor pattern are adjacent to the gate electrode and are disposed at about the same vertical level as the gate electrode.

* * * * *